(12) United States Patent
Jung et al.

(10) Patent No.: US 12,572,230 B2
(45) Date of Patent: Mar. 10, 2026

(54) ELECTRONIC DEVICE HAVING DIGITIZERS IN FOLDING AND NON-FOLDING AREAS

(71) Applicant: Samsung Display Co., LTD., Yongin-si (KR)

(72) Inventors: Sung-Ki Jung, Yongin-si (KR); Minjee Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/677,080

(22) Filed: May 29, 2024

(65) Prior Publication Data

US 2025/0044889 A1 Feb. 6, 2025

(30) Foreign Application Priority Data

Aug. 1, 2023 (KR) ........................ 10-2023-0100720

(51) Int. Cl.
| | |
|---|---|
| *G06F 3/041* | (2006.01) |
| *G06F 3/046* | (2006.01) |
| *H05K 5/00* | (2006.01) |
| *H05K 5/02* | (2006.01) |

(52) U.S. Cl.
CPC ........ *G06F 3/0412* (2013.01); *G06F 3/04164* (2019.05); *G06F 3/046* (2013.01); *H05K 5/0018* (2022.08); *H05K 5/0217* (2013.01); *G06F 2203/04102* (2013.01)

(58) Field of Classification Search
CPC .... G06F 3/0412; G06F 3/04164; G06F 3/046; G06F 2203/04102; H05K 5/0018; H05K 5/0217
See application file for complete search history.

(56) References Cited

U.S. PATENT DOCUMENTS

| | | | |
|---|---|---|---|
| 11,314,367 | B2 | 4/2022 | Jung |
| 2022/0043481 | A1 | 2/2022 | Shin et al. |
| 2022/0075411 | A1* | 3/2022 | Lee ........................ G06F 1/1616 |
| 2022/0375880 | A1 | 11/2022 | Kim |

(Continued)

FOREIGN PATENT DOCUMENTS

| | | |
|---|---|---|
| KR | 1020200124099 A | 11/2020 |
| KR | 1020210133342 A | 11/2021 |
| KR | 1020220079391 A | 6/2022 |

(Continued)

*Primary Examiner* — Lisa S Landis
(74) *Attorney, Agent, or Firm* — CANTOR COLBURN LLP

(57) ABSTRACT

An electronic device includes: a display panel including a display surface including a folding area foldable with respect to a folding axis extending in a first direction, a first non-folding area defined on one side of the folding area, and a second non-folding area defined to be spaced apart from the first non-folding area with the folding area interposed therebetween in a second direction intersecting the first direction, a first digitizer overlapping the first non-folding area, a second digitizer spaced apart from the first digitizer and overlapping the second non-folding area, a third digitizer overlapping the folding area, and a connection member connected to the third digitizer, and the connection member is connected to the first digitizer and spaced apart from the second digitizer.

20 Claims, 18 Drawing Sheets

(56) References Cited

U.S. PATENT DOCUMENTS

| | | |
|---|---|---|
| 2023/0074833 A1 | 3/2023 | Cho et al. |
| 2023/0289021 A1 | 9/2023 | Jeon et al. |

FOREIGN PATENT DOCUMENTS

| | | |
|---|---|---|
| KR | 1020220158202 A | 11/2022 |
| KR | 1020230036581 A | 3/2023 |
| KR | 1020230134629 A | 9/2023 |

* cited by examiner

DGS

RCH

HOP

HIP

RCV

VOP VIP

DR2

DR3    DR1

HOP ⎫
VOP ⎭ OP

HIP ⎫
VIP ⎭ IP

RCH ⎫
RCV ⎭ RC

Figure 9B:
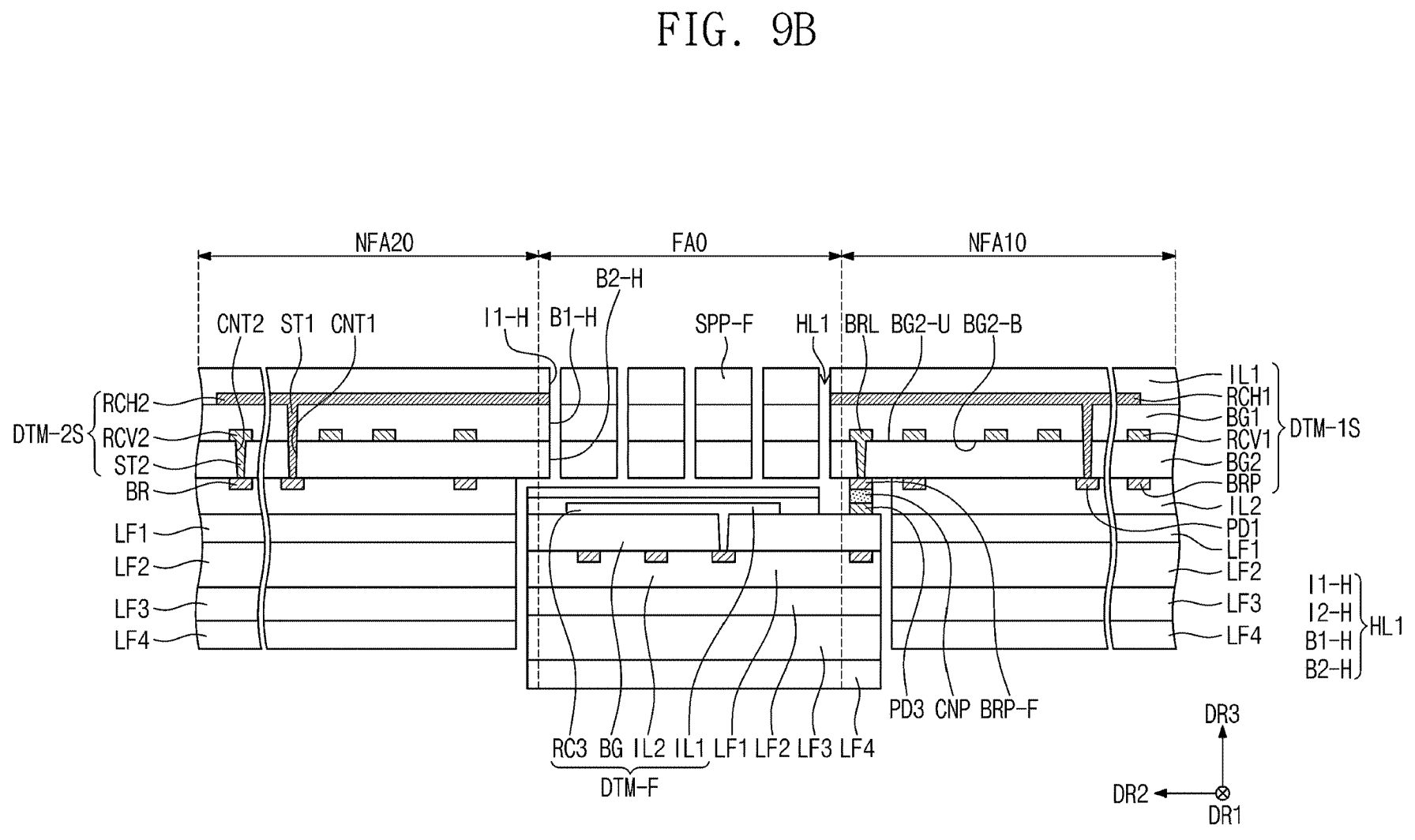

DTM-1S { IL1 RCH1 BG1 RCV1 BG2 BRP

IL2 PD1 LF1 LF2 LF3 LF4

HL1 { I1-H I2-H B1-H B2-H

NFA10

FA0

NFA20

BRL BG2-U BG2-B

HL1

SPP-F

B2-H

I1-H B1-H

PD3 CNP BRP-F

RC3 BG IL2 IL1 LF1 LF2 LF3 LF4
DTM-F

CNT2 ST1 CNT1

RCH2 RCV2 ST2 BR    LF1 LF2 LF3 LF4
DTM-2S

DR3 ⊗ DR1
DR2

ELECTRONIC DEVICE HAVING DIGITIZERS IN FOLDING AND NON-FOLDING AREAS

This application claims priority to Korean Patent Application No. 10-2023-0100720, filed on Aug. 1, 2023, and all the benefits accruing therefrom under 35 U.S.C. § 119, the content of which in its entirety is herein incorporated by reference.

BACKGROUND

Embodiments of the present disclosure described herein relate to an electronic device including a digitizer, and more particularly, relate to an electronic device including a digitizer having improved sensitivity in a folding area.

In the information society, importance of electrodes devices as a visual information transmission medium is increasing. The electronic device is activated by receiving an electrical signal. The electronic device includes a digitizer that detects input applied from the outside of a display layer that displays an image.

The digitizer of the electronic device may include various detection coils to be activated by the electrical signal. Regions in which the detection coils are activated react to signals applied from the outside.

SUMMARY

Embodiments of the present disclosure provide an electronic device including a digitizer that may detect an external input, prevent sensitivity degradation due to a folding stress, and provide uniform sensitivity even in a folding area.

According to an embodiment, an electronic device includes: a display panel including a display surface including a folding area, a first non-folding area, and a second non-folding area, and a rear surface opposite to the display surface, where the folding area is foldable with respect to a folding axis extending in a first direction, the first non-folding area is defined on one side of the folding area, and the second non-folding area is defined to be spaced apart from the first non-folding area with the folding area interposed therebetween in a second direction intersecting the first direction; a first digitizer disposed on the rear surface and overlapping the first non-folding area; a second digitizer disposed on the rear surface, spaced apart from the first digitizer, and overlapping the second non-folding area; a third digitizer disposed on the rear surface and overlapping the folding area; and a connection member connected to the third digitizer, where the connection member is connected to the first digitizer and spaced apart from the second digitizer.

The electronic device may further include a support member disposed on the rear surface of the display panel, where the support member includes a first non-folding part disposed between the display panel and the first digitizer and overlapping the first non-folding area, a second non-folding part disposed between the display panel and the second digitizer and overlapping the second non-folding area, and a folding part disposed between the display panel and the third digitizer, connected to the first non-folding part and the second non-folding part, and overlapping the folding area, and a plurality of holes may be defined in the folding part.

The support member may include a base layer, and the base layer may include a plurality of fiber lines.

The first digitizer may be disposed inside the first non-folding part, the second digitizer may be disposed inside the second non-folding part, and the third digitizer may be spaced apart from the folding part in a cross-sectional view.

The first digitizer may include a sensor that detects an external input applied to the first non-folding area, and a bridge electrically insulated from the sensor, and the third digitizer may be connected to the bridge.

The first digitizer may include a first pad part and a connection pad part, the connection pad part may be spaced apart from the first pad part in the second direction and closer to the folding area than the first pad part, the sensor may include a first loop coil overlapping the first non-folding area, a first input pad connected to one end of the first loop coil, and a first output pad connected to the other end of the first loop coil, the bridge may include a bridge line, a first bridge pad connected to one end of the bridge line, and a second bridge pad connected to the other end of the bridge line, the first input pad, the first output pad, and the first bridge pad may be arranged in the first pad part, and the second bridge pad may be disposed in the connection pad part.

The connection member may electrically connect the second bridge pad and the third digitizer.

The connection member may include an anisotropic conductive film.

The electronic device may further include an adhesive member spaced apart from the connection member in the first direction.

The first digitizer may include glass fiber reinforced plastic, carbon fiber reinforced plastic, or prepreg.

The electronic device may further include a support plate disposed between the display panel and the first to third digitizers, where the support plate may include a first non-folding part overlapping the first digitizer, a second non-folding part overlapping the second digitizer, and a folding part overlapping the third digitizer, and a plurality of holes may be defined through the folding part.

The support plate may include glass fiber reinforced plastic, carbon fiber reinforced plastic, or prepreg.

According to an embodiment, an electronic device includes: a display panel including a display surface including a folding area folded with respect to a folding axis extending in a first direction, a first non-folding area defined on one side of the folding area, and a second non-folding area defined to be spaced apart from the first non-folding area with the folding area interposed therebetween in a second direction intersecting the first direction, and a rear surface opposite to the display surface, a digitizer that detects an electromagnetic pen, and a support plate which is disposed between the digitizer and the display panel and in which a plurality of holes overlapping the folding area are defined, where the digitizer includes a first digitizer disposed on the rear surface and overlapping the first non-folding area, a second digitizer disposed on the rear surface, spaced apart from the first digitizer, and overlapping the second non-folding area, a third digitizer disposed on the rear surface and overlapping the folding area, and an anisotropic conductive film that connects the third digitizer and the first digitizer.

The first digitizer and the second digitizer may be in contact with the support plate, and the third digitizer may be spaced apart from the support plate.

The first digitizer may include a first loop coil, a bridge line electrically insulated from the first loop coil, a first pad connected to the first loop coil, a first bridge pad connected to one end of the bridge line, and a second bridge pad connected to the other end of the bridge line, and the anisotropic conductive film may be connected to the second bridge pad, and the second bridge pad may be closer to the folding area than the first bridge pad.

The third digitizer may include a third loop coil and a third pad connected to the third loop coil, and the anisotropic conductive film may be disposed between the second bridge pad and the third pad.

The first loop coil may not overlap the folding area in an unfolded state of the electronic device.

The support plate may include glass fiber reinforced plastic, carbon fiber reinforced plastic, or prepreg.

The first digitizer and the second digitizer may include glass fiber reinforced plastic, carbon fiber reinforced plastic, or prepreg.

The electronic device may further include an adhesive member that couples the third digitizer and the support plate, where the adhesive member is spaced apart from the aniso-tropic conductive film in the first direction.

BRIEF DESCRIPTION OF THE FIGURES

The above and other objects and features of the present disclosure will become apparent by describing in detail embodiments thereof with reference to the accompanying drawings.

FIGS. 7A and 7B are cross-sectional views illustrating a portion of the electronic device according to an embodiment of the present disclosure.

FIGS. 9A and 9B are cross-sectional views illustrating a portion of the electronic device according to an embodiment of the present disclosure.

DETAILED DESCRIPTION

Figure 1A:
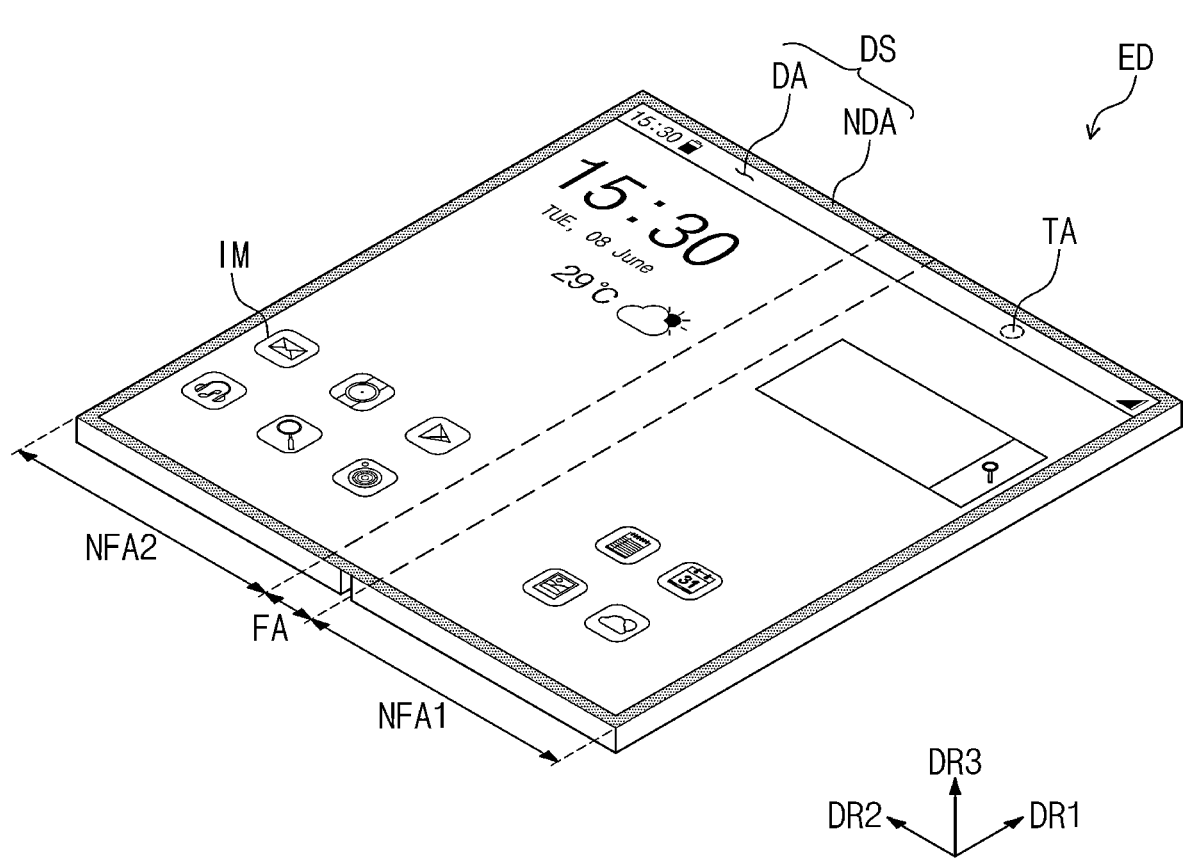
FIGS. 1A to 1C are perspective views of an electronic device according to an embodiment of the present disclosure.

In the present specification, the expression that a first component (or an area, a layer, a part, a portion, etc.) is "disposed on", "connected with" or "coupled to" a second component means that the first component is directly dis-posed on/connected with/coupled to the second component or means that a third component is interposed therebetween.

The same reference numerals refer to the same compo-nents. Further, in the drawings, the thickness, the ratio, and the dimension of components are exaggerated for effective description of technical contents.

The term "and/or" includes all combinations of one or more components that may be defined by associated con-figurations.

The terms "first", "second", etc. are used to describe various components, but the components should not be limited by the terms. The terms are only used to distinguish one component from another component. For example, without departing from the right scope of the present dis-closure, a first component may be referred to as a second component, and similarly, the second component may be also referred to as the first component. Singular expressions include plural expressions unless clearly otherwise indicated in the context.

Further, the terms "under", "beneath", "on", "above", etc. are used to describe a relationship between components illustrated in the drawings. The terms have relative concepts and are described with reference to a direction indicated in the drawing.

Unless otherwise defined, all terms (including technical terms and scientific terms) used in the present specification have the same meaning as commonly understood by those skilled in the art to which the present disclosure belongs. Further, terms defined in commonly used dictionaries should be construed as having the same meanings as those in the context of the related art, and may be explicitly defined therein unless the terms are interpreted in an ideal or excessive formal meaning.

It will be understood that the terms "include", "comprise", "have", etc. specify the presence of features, numbers, steps, operations, elements, or components, described in the speci-fication, or a combination thereof, not precluding the pres-ence or additional possibility of one or more other features, numbers, steps, operations, elements, or components or a combination thereof.

Hereinafter, an embodiment of the present disclosure will be described with reference to accompanying drawings.

In the present specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same compo-nents. Further, in the drawings, the thickness, the ratio, and the dimension of components are exaggerated for effective description of technical contents. The expression "and/or" includes one or more combinations which associated com-ponents are capable of defining.

Although the terms "first", "second", etc. may be used to describe various components, the components should not be limited by the terms. The terms are only used to distinguish one component from another component. For example, without departing from the right scope of the present dis-closure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, an embodiment of the present disclosure will be described with reference to accompanying drawings.

Figure 1B:
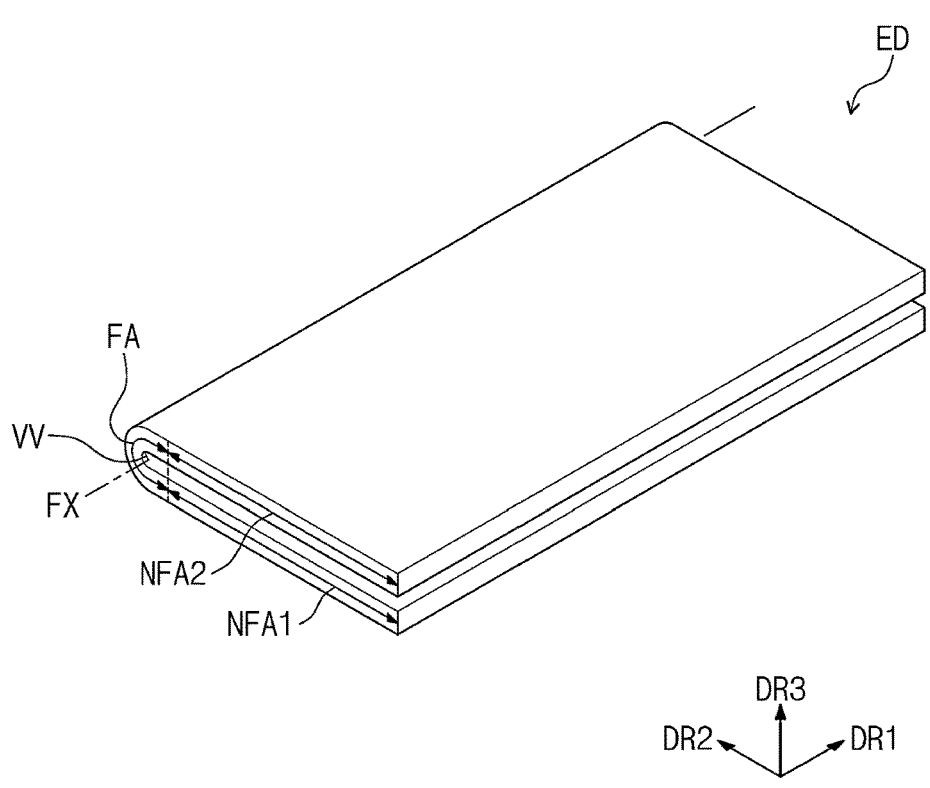
Figure 1C:
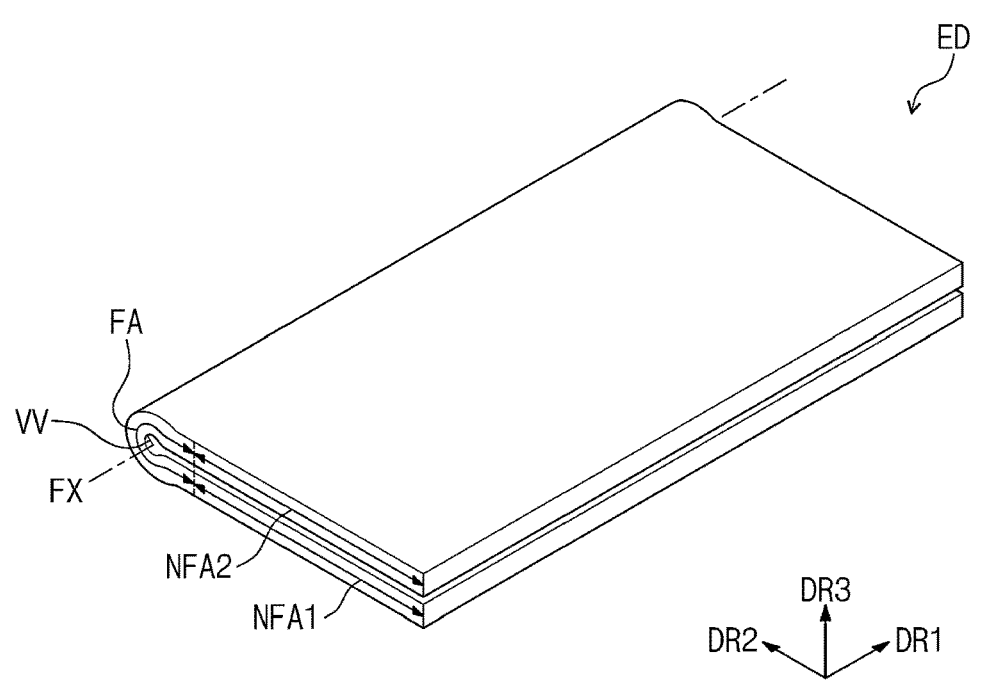

FIGS. 1A to 1C are perspective views of an electronic device according to an embodiment of the present disclosure. FIG. 1A illustrates an unfolded state of the electronic device, and FIGS. 1B and 1C illustrate a folded state of the electronic device.

Referring to FIGS. 1A to 1C, an electronic device ED according to an embodiment of the present disclosure may include a display surface DS defined by a first direction DR1 and a second direction DR2 intersecting the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, the present disclosure is not limited thereto, and the shape of the display area DA and the shape of the non-display area NDA may be modified.

The display surface DS may include a sensing area TA. The sensing area TA may be a partial area of the display area DA. The sensing area TA has a higher light transmittance than those of other areas of the display area DA. Hereinafter, other areas of the display area DA except for the sensing area TA may be defined as a general display area.

An optical signal, for example, a visible light beam or an infrared light beam, may move to the sensing area TA. The electronic device ED may capture an external image through the visible light beam passing through the sensing area TA or determine accessibility of an external object through the infrared light beam. FIG. 1A exemplarily illustrates one sensing area TA, but the present disclosure is not limited thereto, and a plurality of sensing areas TA may be provided.

Hereinafter, a direction substantially perpendicular to a plane defined by the first direction DR1 and the second direction DR2 is defined as a third direction DR3. The third direction DR3 serves as a standard for distinguishing a front surface and a rear surface of each of members. In the present specification, the wording "in a plan view" may be defined as a state viewed in the third direction DR3.

The electronic device ED may include a folding area FA and a plurality of non-folding areas NFA1 and NFA2. The non-folding areas NFA1 and NFA2 may include the first non-folding area NFA1 and the second non-folding area NFA2. The first non-folding area NFA1 and the second non-folding area NFA2 may be spaced apart from each other in the second direction DR2 with the folding area FA interposed therebetween.

As illustrated in FIG. 1B, the folding area FA may be folded with respect to a folding axis FX parallel to the first direction DR1. The folding area FA has a predetermined curvature and a radius VV of curvature. A distance between the first non-folding area NFA1 and the second non-folding area NFA2 may be substantially equal to twice the radius VV of curvature. According to an embodiment, the first non-folding area NFA1 and the second non-folding area NFA2 may face each other, and the electronic device ED may be folded in an in-folding manner such that the display surface DS is not exposed to the outside.

As illustrated in FIG. 1C, the distance between the first non-folding area NFA1 and the second non-folding area NFA2 may be less than twice the radius VV of curvature. Thus, in a folded state, the separation distance between the first non-folding area NFA1 and the second non-folding area NFA2 may be reduced. Accordingly, the electronic device ED having a slim state when being folded may be provided.

However, the present disclosure is not limited thereto, and in an embodiment, the electronic device ED may be out-folded so that the display surface DS is exposed to the outside. In an embodiment of the present disclosure, the electronic device ED may be configured to repeatedly perform an in-folding operation and an out-folding operation from an unfolding operation, but the present disclosure is not limited thereto. In an embodiment of the present disclosure, the electronic device ED may select any one of the unfolding operation, the in-folding operation, and the out-folding operation.

Figure 2A:
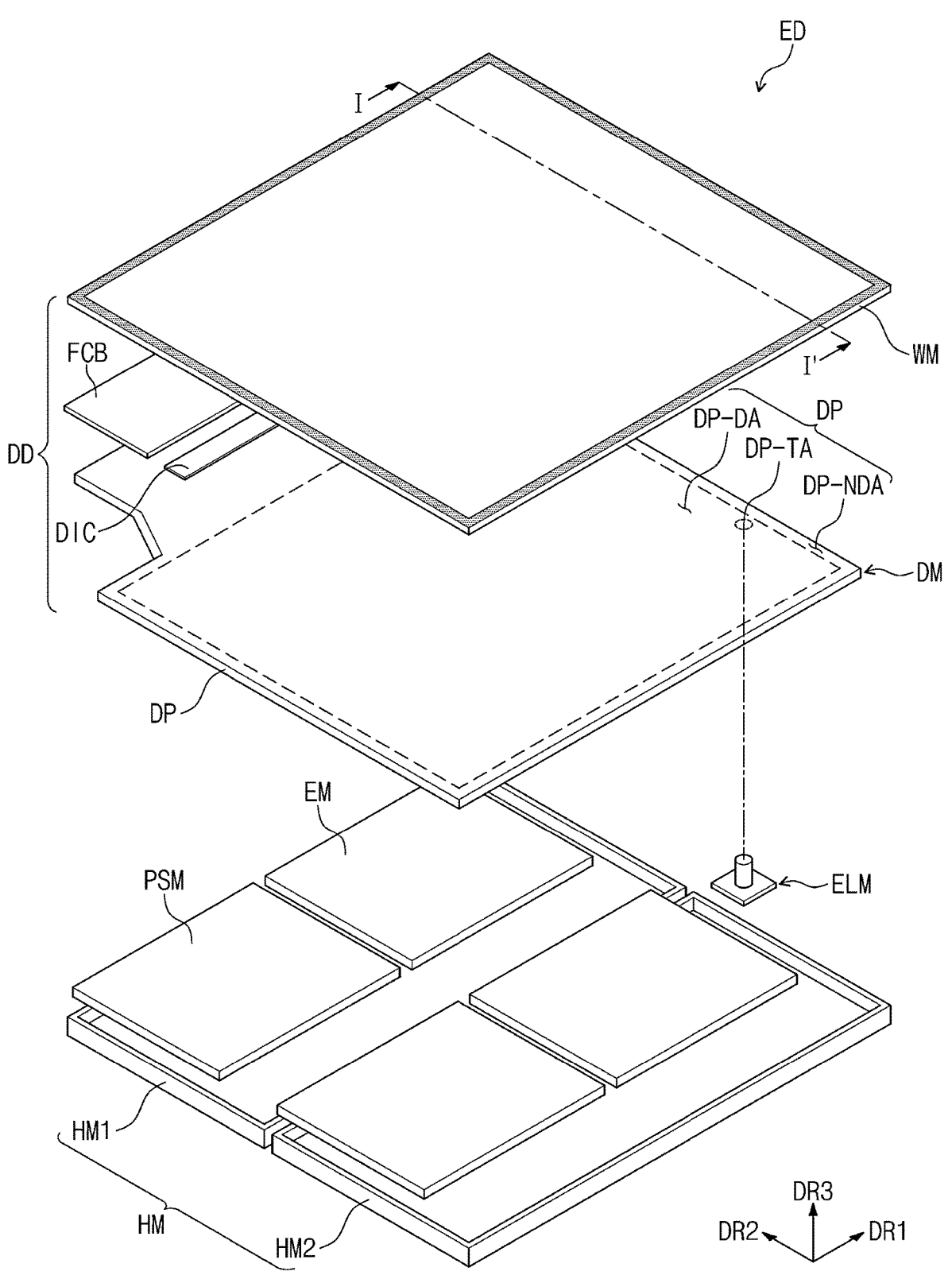
FIG. 2A is an exploded perspective view of the electronic device according to an embodiment of the present disclosure.
Figure 2B:
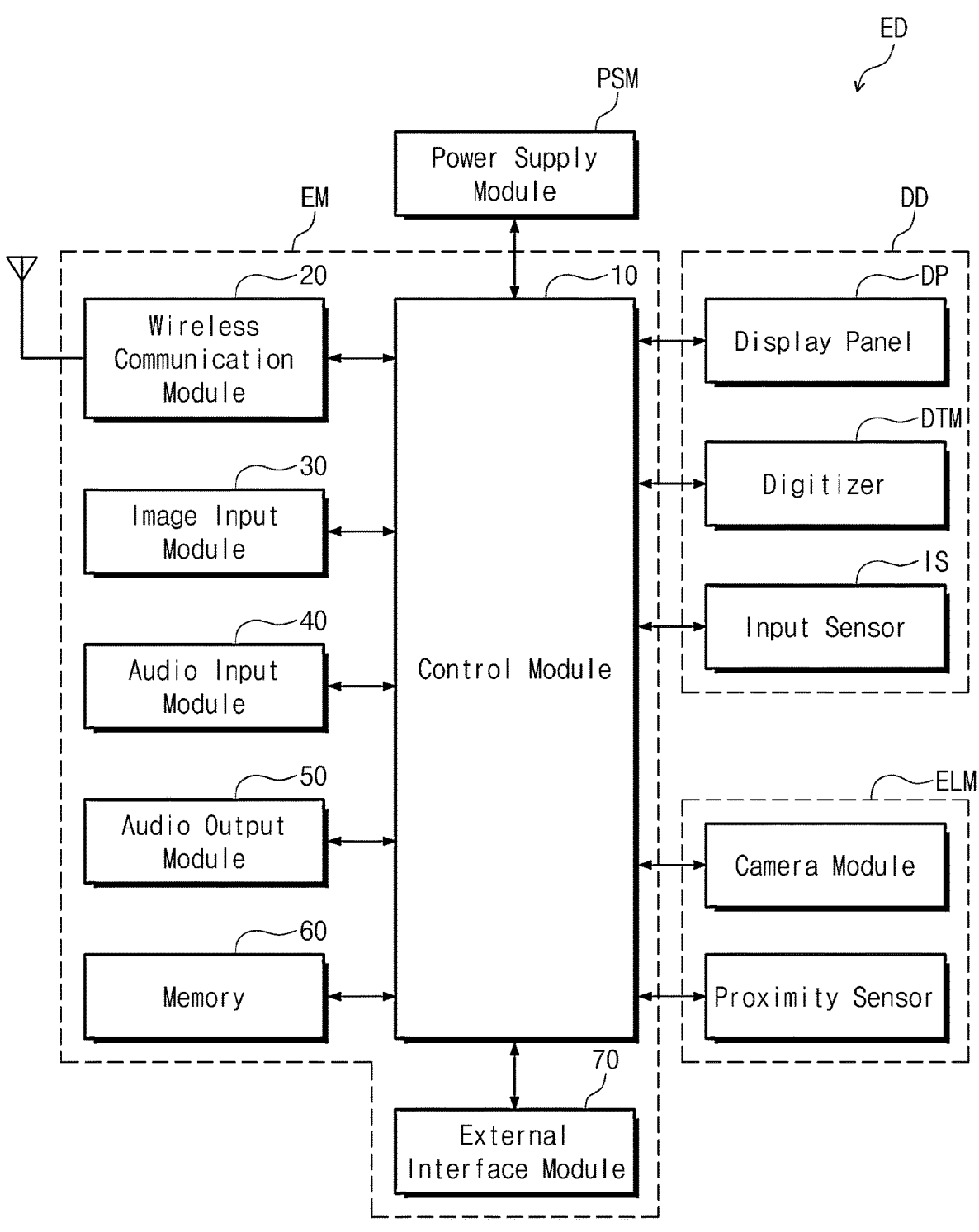
FIG. 2B is a block diagram of the electronic device according to an embodiment of the present disclosure.

FIG. 2A is an exploded perspective view of the electronic device according to an embodiment of the present disclosure. FIG. 2B is a block diagram of the electronic device according to an embodiment of the present disclosure.

Referring to FIGS. 2A and 2B, the electronic device ED may include a display device DD, an electronic module EM, an electro-optical module ELM, a power supply module PSM, and a housing HM. Although not separately illustrated, the electronic device ED may further include a mechanical structure (e.g., a hinge) for controlling a folding operation of the display device DD.

The display device DD generates an image and detects an external input. The display device DD may include a window WM, a display module DM, an input sensor IS, and a digitizer DTM. The window WM provides a front surface of the electronic device ED. The window WM will be described below in detail.

The display module DM may include a display panel DP. Although FIG. 2A illustrates only the display panel DP among stacked structures of the display module DM, substantially, the display module DM may further include a plurality of components arranged on the display panel DP. The stacked structures of the display module DM will be described below in detail.

The type of display panel DP is not particularly limited. For example, the display panel DP may be a light emitting display panel such as an organic light emitting display panel or a quantum dot light emitting display panel.

The display panel DP includes a display area DP-DA and a non-display area DP-NDA corresponding to the display area DA (see FIG. 1A) and the non-display area NDA (see FIG. 1A) of the electronic device ED. In the present specification, an expression "an area/part and an area/part correspond to each other" means that the area/part and the area/part overlap each other and is not limited to the same area.

The display panel DP may include a sensing area (first area) DP-TA corresponding to the sensing area TA of FIG. 1A. The sensing area TA may be an area having a lower resolution than the resolution of the display area (second area) DP-DA. The sensing area DP-TA will be described below in detail.

As illustrated in FIG. 2A, a driving chip DIC may be disposed on the non-display area DP-NDA of the display panel DP. A flexible circuit board FCB may be coupled to the non-display area DP-NDA of the display panel DP. The flexible circuit board FCB may be connected to a main circuit board. The main circuit board may be one of electronic components constituting the electronic module EM.

The driving chip DIC may include driving elements, for example, data drive circuits, for driving pixels of the display panel DP. Although a structure, in which the driving chip DIC is mounted on the display panel DP, is illustrated in FIG. 2A, the present disclosure is not limited thereto. For example, the driving chip DIC may be mounted on the flexible circuit board FCB.

The input sensor IS detects input of the user. The capacitive input sensor IS may be disposed on the display panel DP. The digitizer DTM detects input of a stylus pen. The electromagnetic induction-type digitizer DTM may be disposed under the display panel DP.

The electronic module EM may include a control module 10, a wireless communication module 20, an image input module 30, an audio input module 40, an audio output module 50, a memory 60, and an external interface module 70. The electronic module EM may include the main circuit board, and the modules may be mounted on the main circuit board or may be electrically connected to the main circuit board through the flexible circuit board. Each of the input sensor IS and the digitizer DTM may be connected to the main circuit board through a connector or the like. The electronic module EM is electrically connected to the power supply module PSM.

The electronic module EM may be disposed in each of a first housing HM1 and a second housing HM2, and the power supply module PSM may be disposed in each of the first housing HM1 and the second housing HM2. Although not illustrated, the electronic module EM disposed in the first housing HM1 and the electronic module EM disposed in the second housing HM2 may be electrically connected to each other through the flexible circuit board.

The control module 10 controls an overall operation of the electronic device ED. For example, the control module 10 activates or deactivates the display device DD in accordance with user input. The control module 10 may control the image input module 30, the audio input module 40, and the audio output module 50 in accordance with the user input. The control module 10 may include at least one micro processor.

The wireless communication module 20 may transmit/receive a wireless signal to/from another terminal using a Bluetooth line or a Wi-Fi line. The wireless communication module 20 may transmit/receive a voice signal using a general communication line. The wireless communication module 20 may include a plurality of antenna modules.

The image input module 30 processes an image signal and converts the processed image signal into image data that may be displayed on the display device DD. The audio input module 40 receives an external audio signal through a microphone in a recording mode, a voice recognition mode, and the like and converts the received external audio signal into electrical voice data. The audio output module 50 converts audio data received from the wireless communication module 20 or audio data stored in the memory 60 into a sound and outputs the converted sound to the outside.

The external interface module 70 serves as an interface connected to an external charger, a wired/wireless data port, a card socket (e.g., a memory card and a subscriber identification module ("SIM")/user identification module ("UIM") card), and the like.

The power supply module PSM supplies power required for the overall operation of the electronic device ED. The power supply module PSM may include a general battery device.

The electro-optical module ELM may be an electronic component that outputs or receives an optical signal. The electro-optical module ELM may include a camera module and/or a proximity sensor. The camera module captures an external image through the sensing area DP-TA. The electro-optical module ELM may be disposed under the display device DD and may overlap the sensing area DP-TA.

The housing HM is coupled to the window WM to accommodate the other modules described above. It is illustrated that the housing HM includes the first housing HM1 and the second housing HM2, but the present disclosure is not limited thereto. The electronic device ED according to an embodiment may further include a hinge structure for connecting the first housing HM1 and the second housing HM2.

Figure 3A:
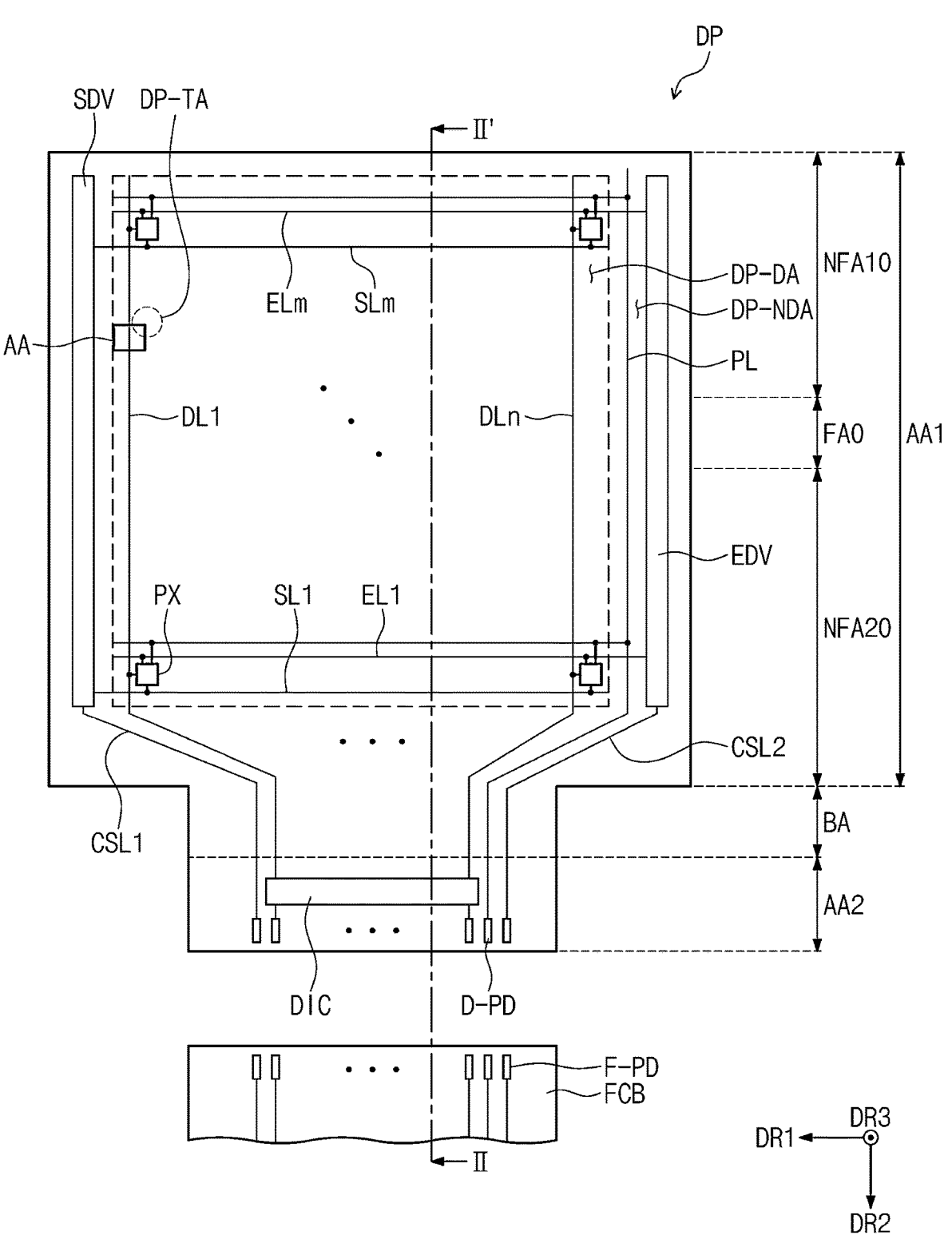
FIG. 3A is a plan view of a display panel according to an embodiment of the present disclosure.
Figure 3B:
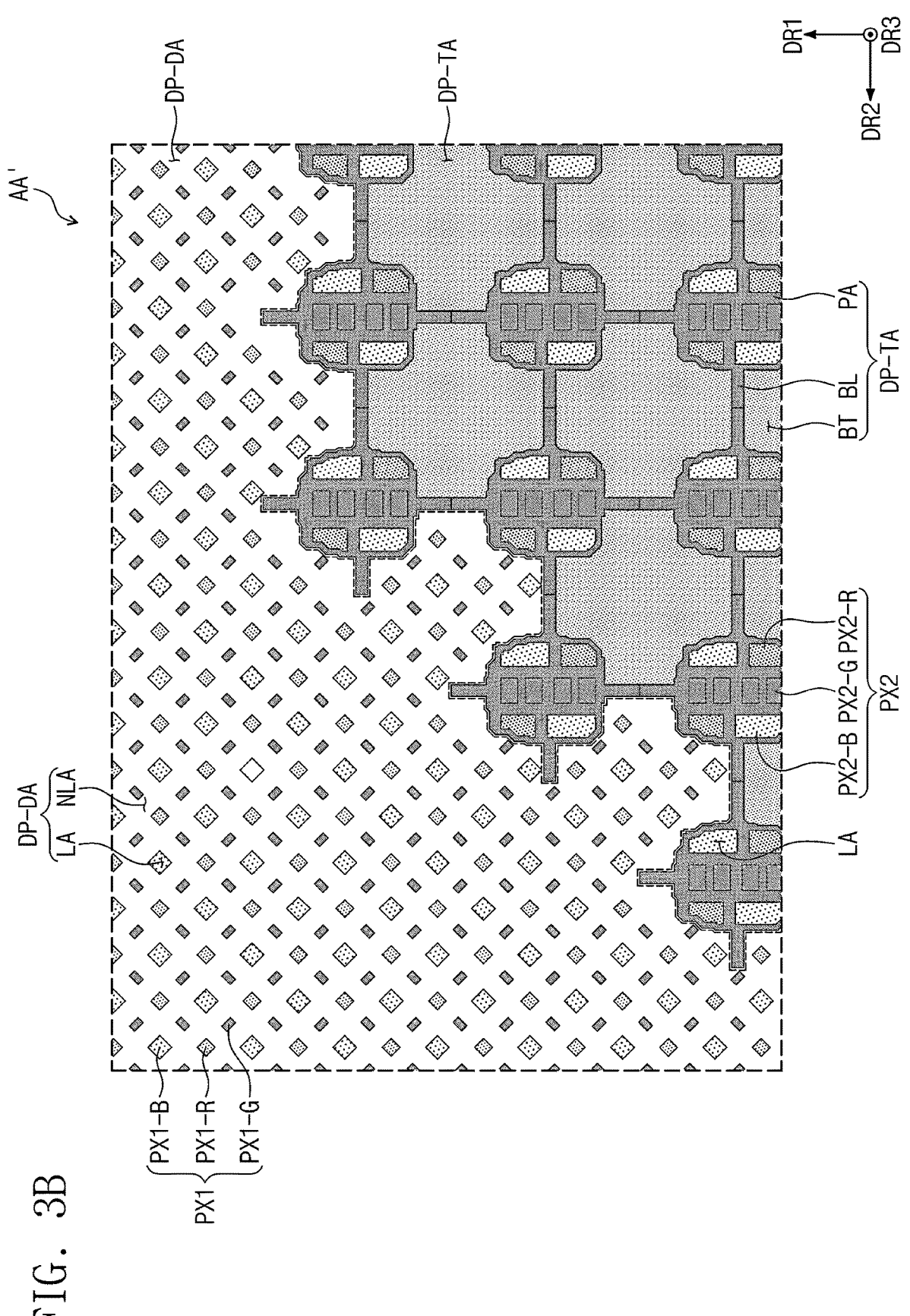
FIG. 3B is an enlarged plan view of a partial area of FIG. 3A.

FIG. 3A is a plan view of the display panel DP according to an embodiment of the present disclosure. FIG. 3B is an enlarged plan view of partial area AA of FIG. 3A.

Referring to FIG. 3A, the display panel DP may include the display area DP-DA and the non-display area DP-NDA disposed around the display area DP-DA. The display area DP-DA and the non-display area DP-NDA are distinguished according to the presence of a pixel PX. The pixel PX is disposed in the display area DP-DA. A scan driving unit SDV, a data driving unit, and a light emitting driving unit EDV may be arranged in the non-display area DP-NDA. The data driving unit may be a partial circuit configured in the driving chip DIC illustrated in FIG. 3A.

The display panel DP includes a first non-bending area AA1, a second non-bending area AA2, and a bending area BA, which are divided in the second direction DR2. The second non-bending area AA2 and the bending area BA may be partial areas of the non-display area DP-NDA. The bending area BA is disposed between the first non-bending area AA1 and the second non-bending area AA2.

The first non-bending area AA1 is an area corresponding to the display surface DS of FIG. 1A. The first non-bending area AA1 may include a first non-folding area NFA10, a second non-folding area NFA20, and a folding area FA0. The first non-folding area NFA10, the second non-folding area NFA20, and the folding area FA0 correspond to the first non-folding area NFA1, the second non-folding area NFA2, and the folding area FA of FIGS. 1A to 1C, respectively.

A length of the bending area BA and the second non-bending area AA2 in the first direction DR1 may be smaller than a length of the first non-bending area AA1. The bending area BA having a relatively short length in the first direction DR1 may be easily bent with respect to a bending axis extending in the first direction DR1.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, a power line PL, and a plurality of display pads D-PD. In this case, "m" and "n" are natural numbers. The pixels PX may be connected to the scan lines SL1 to SLm, the data lines DL1 to DLn, and the light emitting lines EL1 to ELm.

The scan lines SL1 to SLm may extend in the second direction DR2 and may be connected to the scan driving unit SDV. The data lines DL1 to DLn may extend in the second direction DR2 and may be connected to the driving chip DIC via the bending area BA. The light emitting lines EL1 to ELm may extend in the first direction DR1 and may be connected to the light emitting driving unit EDV.

The power line PL may include a portion extending in the second direction DR2 and a portion extending in the first direction DR1. The portion extending in the first direction DR1 and the portion extending in the second direction DR2 may be arranged in different layers. The portion, which extends in the second direction DR2, of the power line PL may extend to the second non-bending area AA2 via the bending area BA. The power line PL may provide a first voltage to the pixels PX.

The first control line CSL1 may be connected to the scan driving unit SDV and may extend toward a lower end of the second non-bending area AA2 via the bending area BA. The second control line CSL2 may be connected to the light emitting driving unit EDV and may extend toward the lower end of the second non-bending area AA2 via the bending area BA.

In a plan view, the display pads D-PD may be arranged adjacent to the lower end of the second non-bending area AA2. The driving chip DIC, the power line PL, the first control line CSL1, and the second control line CSL2 may be connected to the display pads D-PD. Substrate pads F-PD included in the flexible circuit board FCB may be electrically connected to the corresponding display pads D-PD through an anisotropic conductive adhesive layer.

Referring to FIG. 3B, the sensing area (the first area) DP-TA may be an area having a higher light transmittance and a lower resolution than the those of the display area (the second area) DP-DA. The light transmittance and resolution are measured within a reference area. The sensing area DP-TA has a smaller occupancy ratio of a light shielding structure within the reference area than that of the display area DP-DA. The light shielding structure may include a conductive pattern of a circuit layer, an electrode of a light emitting element, a light shielding pattern, and the like, which will be described below.

The sensing area DP-TA has a lower resolution within the reference area than the resolution of the display area DP-DA. The sensing area DP-TA has fewer pixels arranged within the reference area (or the same area) than the display area DP-DA.

As illustrated in FIG. 3B, a first pixel PX1 may be disposed in the display area DP-DA, and a second pixel PX2 may be disposed in the sensing area DP-TA. The first pixel PX1 and the second pixel PX2 may have different light emitting areas when comparing areas of pixels that provide the same color. The first pixel PX1 and the second pixel PX2 may have different arrangements.

FIG. 3B illustrates light emitting areas LA of the first pixel PX1 and the second pixel PX2 while the first pixel PX1 and the second pixel PX2 are represented. Each of the light emitting areas LA may be defined as an area in which an anode of the light emitting element is exposed from a pixel defining film. A non-light emitting area NLA is disposed between the light emitting areas LA within the display area DP-DA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. The first color pixel PX1-R and the first color pixel PX2-R may provide red light beams, the second color pixel PX1-G and the second color pixel PX2-G may provide green light beams, and the third color pixel PX1-B and the third color pixel PX2-B may provide blue light beams.

The sensing area DP-TA may include a pixel area PA, a wiring area BL, and a transmissive area BT. The second pixel PX2 is disposed in the pixel area PA. It is illustrated that two first color pixels PX2-R, four second color pixels PX2-G, and two third color pixels PX2-B are arranged inside the one pixel area PA, but the present disclosure is not limited thereto.

A conductive pattern, a signal line, or a light shielding pattern related to the second pixel PX2 is disposed in the pixel area PA and the wiring area BL. The light shielding pattern may be a metallic pattern and may substantially overlap the pixel area PA and the wiring area BL. The pixel area PA and the wiring area BL may be non-transmissive areas.

The transmissive area BT is an area through which an optical signal substantially passes. Since the second pixel PX2 is not disposed in the transmissive area BT, the conductive pattern, the signal line, or the light shielding pattern is disposed. Thus, the transmissive area BT increases the light transmittance of the sensing area DP-TA. According to an embodiment, the electro-optical module ELM described in FIG. 2A may overlap the sensing area DP-TA having a high light transmittance, thereby improving optical signal reception efficiency.

Figure 4:
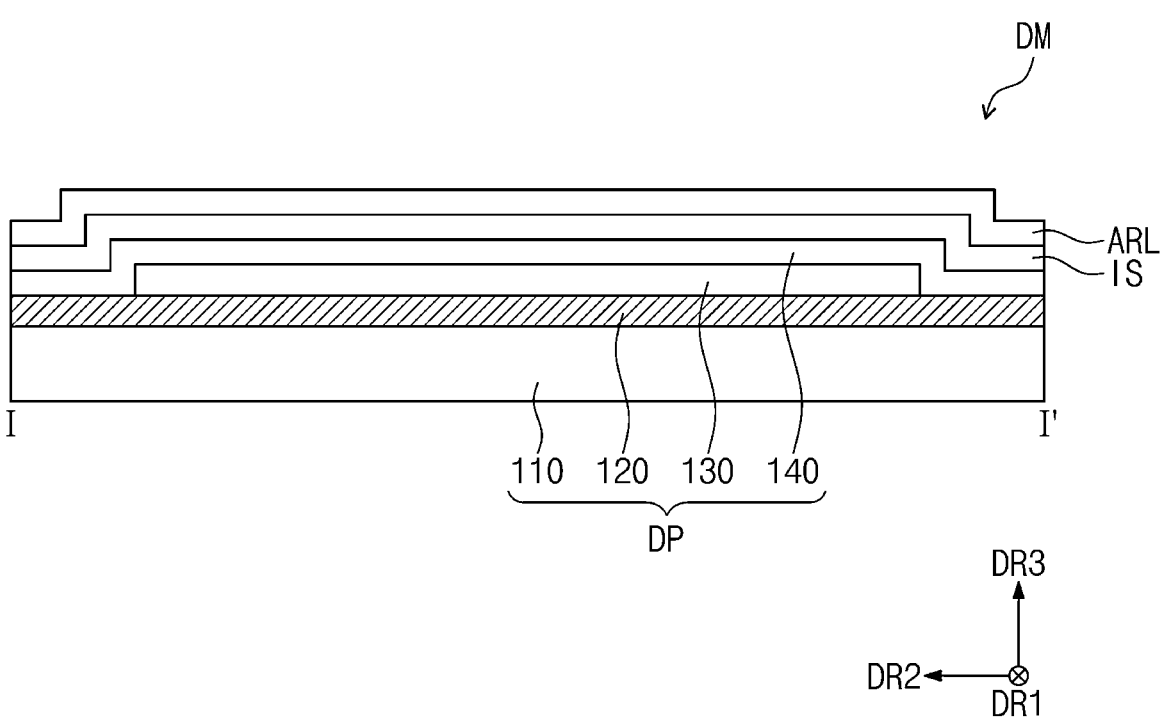
FIG. 4 is a cross-sectional view along line I-I' of FIG. 2A.

FIG. 4 is a cross-sectional view along line I-I' of FIG. 2A

Referring to FIG. 4, the display module DM may include the display panel DP, the input sensor IS, and a reflection preventing layer ARL. The display panel DP may include a base layer 110, a circuit layer 120, a light emitting element layer 130, and an encapsulation layer 140.

The base layer 110 may provide a base surface on which the circuit layer 120 is disposed. The base layer 110 may be a flexible substrate that may be bent, folded, and rolled. The base layer 110 may be a glass substrate, a metal substrate, a polymer substrate, or the like. However, an embodiment of the present disclosure is not limited thereto, and the base layer 110 may be an inorganic layer, an organic layer, or a composite material layer.

The base layer 110 may have a multilayer structure. For example, the base layer 110 may include a first synthetic resin layer, a multi-layer or single-layer inorganic layer, and a second synthetic resin layer disposed on the multi-layer or single-layer inorganic layer. Each of the first and second synthetic resin layers may include a polyimide-based resin, but the present disclosure is not particularly limited thereto.

The circuit layer 120 may be disposed on the base layer 110. The circuit layer 120 may include an insulating layer, a semiconductor pattern, a conductive pattern, a signal line, and the like.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-light emitting diode ("LED"), or a nano-LED.

The encapsulation layer 140 may be disposed on the light emitting element layer 130. The encapsulation layer 140 may protect the light emitting element layer 130 from foreign substances such as moisture, oxygen, and dust particles. The encapsulation layer 140 may include at least one inorganic layer. The encapsulation layer 140 may include a laminated structure of an inorganic layer/organic layer/inorganic layer.

The input sensor IS may be directly disposed on the display panel DP. The display panel DP and the input sensor IS may be formed through a continuous process. Here, the aspect that the input sensor IS is directly disposed on the display panel DP may mean that a third component is not disposed between the input sensor IS and the display panel DP. That is, a separate adhesive layer may not be disposed between the input sensor IS and the display panel DP.

The reflection preventing layer ARL may be directly disposed on the input sensor IS. The reflection preventing layer ARL may reduce a reflectance of an external light beam input from the outside of the display device DD (see FIG. 1). The reflection preventing layer ARL may include color filters. The color filters may have a predetermined arrangement. For example, the color filters may be arranged in consideration of light emitting colors of the pixels PX included in the display panel DP. Further, the reflection preventing layer ARL may further include a black matrix adjacent to the color filters.

In an embodiment of the present disclosure, positions of the input sensor IS and the reflection preventing layer ARL may be changed to each other. In an embodiment of the present disclosure, the reflection preventing layer ARL may be replaced with a polarizing film. The polarizing film may be coupled to the input sensor IS through an adhesive layer.

Figure 5A:
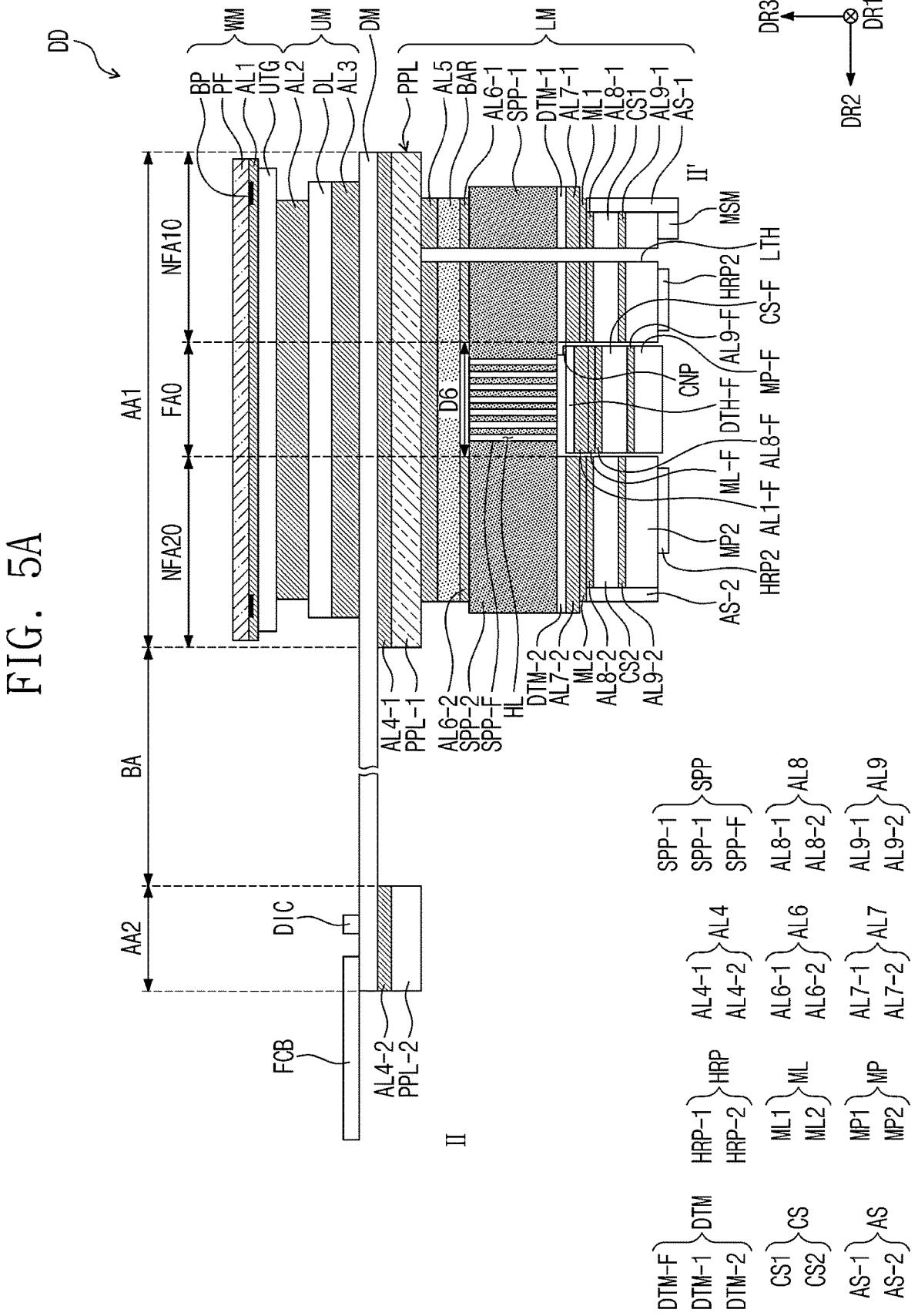
FIG. 5A is a cross-sectional view taken along line II-II' of FIG. 3A.
Figure 5B:
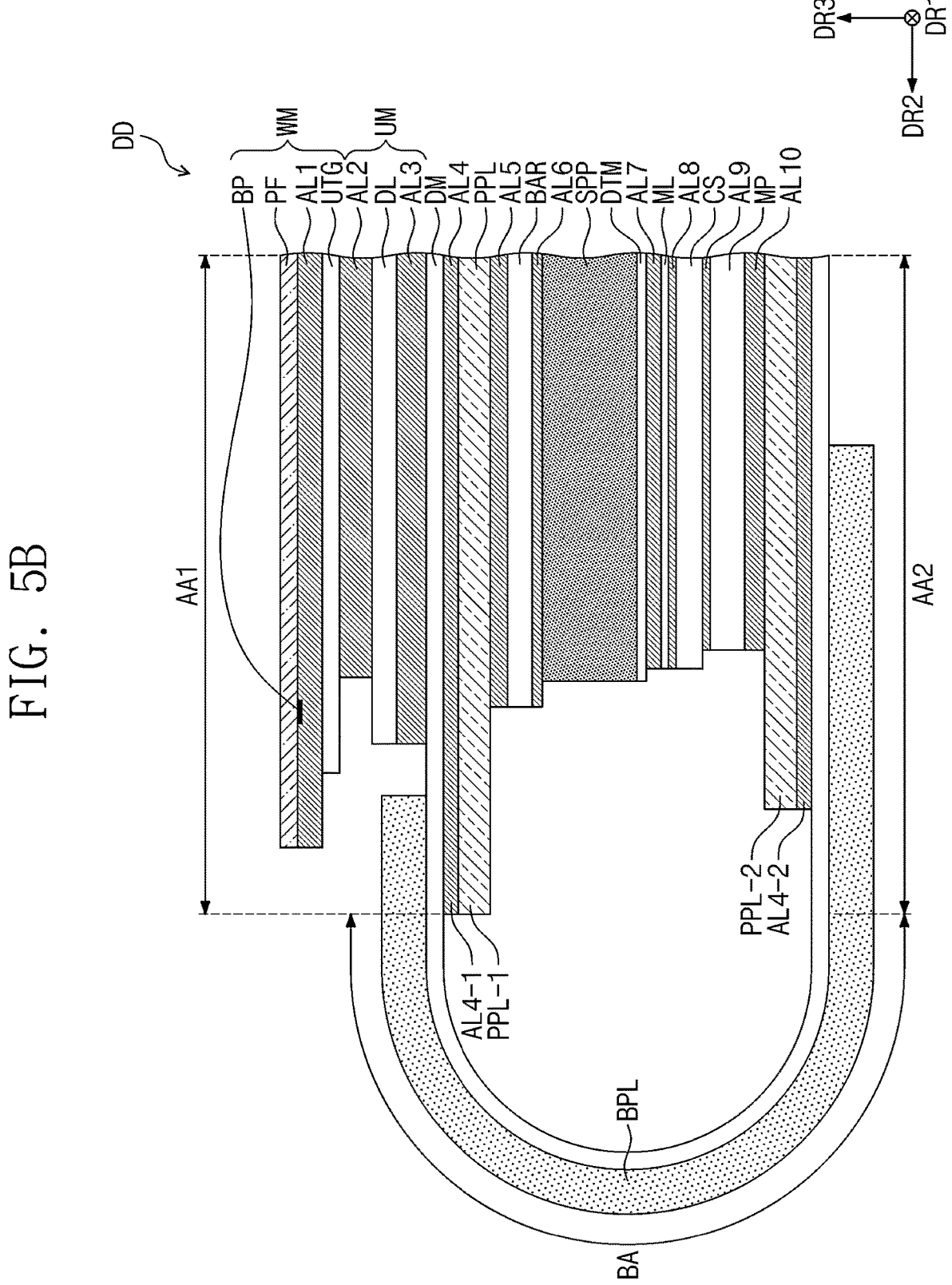
FIG. 5B is a cross-sectional view of a bent display device according to an embodiment of the present disclosure.

FIG. 5A is a cross-sectional view taken along line II-II' of FIG. 3A. FIG. 5B is a cross-sectional view of a bent display device according to an embodiment of the present disclosure. FIG. 5A illustrates a state in which the display module DM is not bent and is unfolded. FIG. 5B illustrates a state in which the bending area BA of the display module DM is bent.

Referring to FIGS. 5A and 5B, the display device DD may include the window WM, an upper member UM, the display module DM, a support plate SPP (in other words, support member), the digitizer DTM, and a lower member LM. In an embodiment, the upper member UM commonly refers to a component disposed between the window WM and the display module DM, and the lower member LM commonly refers to a component disposed under the digitizer DTM.

The window WM may include a thin film glass substrate UTG, a window protecting layer PF disposed on the thin film glass substrate UTG, and a bezel pattern BP disposed on a lower surface of the window protecting layer PF. In an embodiment, the window protecting layer PF may include a synthetic resin film.

The bezel pattern BP may be disposed on one surface of the thin film glass substrate UTG or one surface of the window protecting layer PF. FIG. 5A exemplarily illustrates the bezel pattern BP disposed on the lower surface of the window protecting layer PF. The present disclosure is not limited thereto, and the bezel pattern BP may be disposed on an upper surface of the window protecting layer PF. The bezel pattern BP, which is a colored light shielding film, may be formed by, for example, a coating method. The bezel pattern BP may include a base material and a dye or pigment mixed with the base material. The non-display area NDA illustrated in FIG. 1A may be defined by a shape of the bezel pattern BP.

A thickness of the thin film glass substrate UTG may be in a range of 15 micrometers (μm) to 45 μm. The thin film glass substrate UTG may be made of a chemically strengthened glass. Even when the thin film glass substrate UTG is repeatedly folded and unfolded, occurrence of wrinkles may be minimized.

A thickness of the window protecting layer PF may be in a range of 50 μm to 80 μm. A synthetic resin film of the window protecting layer PF may include polyimide, polycarbonate, polyamide, triacetylcellulose, polymethylmethacrylate, or polyethylene terephthalate. Although not separately illustrated, at least one of a hard coating layer, a fingerprint preventing layer, and a reflection preventing layer may be disposed on the upper surface of the window protecting layer PF.

The window protecting layer PF and the thin film glass substrate UTG may be coupled to each other by a first adhesive layer AL1. The first adhesive layer AL1 may be a pressure sensitive adhesive ("PSA") film or an optically clear adhesive ("OCA") member. Adhesive layers described below may also include the same adhesive as that of the first adhesive layer AL1.

The first adhesive layer AL1 may be separated from the thin film glass substrate UTG. That is, an adhesive force between the first adhesive layer AL1 and the thin film glass substrate UTG may be smaller than an adhesive force between the first adhesive layer AL1 and the window protecting layer PF. As the window protecting layer PF is disposed on an upper side, scratches may occur relatively easily as compared to the thin film glass substrate UTG. After the first adhesive layer AL1 and the window protecting layer PF are separated from each other, a new window protecting layer PF may be attached to the thin film glass substrate UTG.

In a plan view, an edge of the thin film glass substrate UTG may not overlap the bezel pattern BP. As the above-described conditions are satisfied, the edge of the thin film glass substrate UTG may be exposed from the bezel pattern BP, and fine cracks occurring in the edge of the thin film glass substrate UTG may be inspected through an inspection device.

The upper member UM includes an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb an external impact applied to a front surface of the display device DD. The display module DM described with reference to FIG. 4 may include the reflection preventing layer ARL that replaces the polarizing film, and accordingly, a front impact strength of the display device DD may be reduced. The upper film DL may compensate for the reduced impact strength by applying the reflection preventing layer ARL. In an embodiment of the present disclosure, the upper film DL may be omitted. The thin film glass substrate UTG and the upper film DL may be coupled to each other by a second adhesive layer AL2. The upper film DL and the display module DM may be coupled to each other by a third adhesive layer AL3.

A panel protecting layer PPL may be disposed under the display module DM. The panel protecting layer PPL may protect a lower portion of the display module DM. The panel protecting layer PPL may include a flexible synthetic resin film. For example, the panel protecting layer PPL may include polyethylene terephthalate.

In an embodiment, the panel protecting layer PPL may not be disposed in the bending area BA. The panel protecting layer PPL may include a first panel protecting layer PPL-1 that protects the first non-bending area AA1 of the display panel DP (see FIG. 3A) and a second panel protecting layer PPL-2 that protects the second non-bending area AA2.

A fourth adhesive layer AL4 couples the panel protecting layer PPL and the display module DM. The fourth adhesive layer AL4 may include a first part AL4-1 corresponding to the first panel protecting layer PPL-1 and a second part AL4-2 corresponding to the second panel protecting layer PPL-2.

As illustrated in FIG. 5B, when the bending area BA is bent, the second panel protecting layer PPL-2 together with the second non-bending area AA2 may be disposed under the first non-bending area AA1 and the first panel protecting layer PPL-1. Since the panel protecting layer PPL is not disposed in the bending area BA, the bending area BA may be more easily bent. The second panel protecting layer PPL-2 may be attached to a metal plate MP through a tenth adhesive layer AL10. The tenth adhesive layer AL10 may be omitted. Although not separately illustrated, an additional component such as an insulating tape may be further disposed between the second panel protecting layer PPL-2 and the metal plate MP.

As illustrated in FIG. 5B, the bending area BA has a predetermined curvature and a radius of curvature. The radius of curvature may be in a range of about 0.1 mm to 0.5 mm. A bending protecting layer BPL is at least disposed in the bending area BA. The bending protecting layer BPL may overlap the bending area BA, the first non-bending area AA1, and the second non-bending area AA2. The bending protecting layer BPL may be disposed on an entire area of the bending area BA and may be disposed at a portion of the first non-bending area AA1 and a portion of the second non-bending area AA2.

The bending protecting layer BPL may be bent together with the bending area BA. The bending protecting layer BPL protects the bending area BA from an external impact and controls a neutral surface of the bending area BA. The bending protecting layer BPL controls a stress of the bending area BA so that signal lines arranged in the bending area BA become closer to the neutral surface.

A barrier layer BAR may be disposed under the panel protecting layer PPL. The barrier layer BAR and the panel protecting layer PPL may be coupled to each other through a fifth adhesive layer AL5.

The barrier layer BAR may increase resistance against a compressive force caused by external pressure. Thus, the barrier layer BAR may serve to prevent deformation of the display panel DP. The barrier layer BAR may include a flexible plastic material such as polyimide or polyethylene terephthalate. Further, the barrier layer BAR may be a colored film having a low light transmittance. The barrier layer BAR may absorb a light beam input from the outside. For example, the barrier layer BAR may be a black synthetic resin film. When the display device DD is viewed from an upper side of the window protecting layer PF, components arranged under the barrier layer BAR may not be visually recognized by the user.

A sixth adhesive layer AL6 couples the barrier layer BAR and the support plate SPP. The sixth adhesive layer AL6 may include a first part AL6-1 and a second part AL6-2 spaced apart from each other. A separation distance between the first part AL6-1 and the second part AL6-2 may correspond to a width of the folding area FA0.

In an embodiment, the first part AL6-1 and the second part AL6-2 are defined as different parts of one adhesive layer, but the present disclosure is not limited thereto. When the first part AL6-1 is defined as one adhesive layer (e.g., a first adhesive layer or a second adhesive layer), the second part AL6-2 may also be defined as another adhesive layer (e.g., the second adhesive layer or a third adhesive layer). The above-described definitions may be applied to all adhesive layers including two parts among adhesive layers, which will be described below, as well as the sixth adhesive layer AL6.

The support plate SPP is disposed under the display panel DP. The support plate SPP supports the display panel DP when folded. The support plate SPP may have insulating properties. The support plate SPP may include a reinforced fiber composite material. The reinforced fiber composite material may be one of a carbon fiber-reinforced plastic ("CFRP") or a glass fiber-reinforced plastic ("GFRP"). A detailed description thereof will be made below.

According to an embodiment, the support plate SPP may include a first non-folding part SPP-1 overlapping the first non-folding area NFA10, a second non-folding part SPP-2 overlapping the second non-folding area NFA20, and a folding part SPP-F overlapping the folding area FA0. The first non-folding part SPP-1, the second non-folding part SPP-2, and the folding part SPP-F may have an integrated shape in which the first non-folding part SPP-1, the second non-folding part SPP-2, and the folding part SPP-F are connected to each other.

Holes HL passing in the third direction DR3 that is a thickness direction may be defined in the folding part SPP-F. As the holes are defined in the folding part SPP-F of the support plate SPP, the shape of the support plate SPP may be easily changed during a folding operation of the electronic device ED.

The digitizer DTM may be disposed under the support plate SPP. The digitizer DTM according to the present disclosure may detect input by an electromagnetic pen. In this case, the digitizer DTM may detect the input by the electromagnetic pen in a manner using electromagnetic resonance ("EMR").

The digitizer DTM may include a first digitizer DTM-1 overlapping the first non-folding area NFA10, a second digitizer DTM-2 overlapping the second non-folding area NFA20, and a third digitizer DTM-F overlapping the folding area FA0.

The first digitizer DTM-1 is disposed to overlap the first non-folding area NFA10. In an embodiment, the first digitizer DTM-1 may be disposed on a rear surface of the first non-folding part SPP-1. The first digitizer DTM-1 detects the input by the electromagnetic pen, which is applied to the first non-folding area NFA10.

The second digitizer DTM-2 is disposed to overlap the second non-folding area NFA20. In an embodiment, the second digitizer DTM-2 may be disposed on a rear surface of the second non-folding part SPP-2. The second digitizer DTM-2 detects the input by the electromagnetic pen, which is applied to the second non-folding area NFA20.

The first digitizer DTM-1 may be spaced apart from the second digitizer DTM-2 in a plan view. That is, each of the first digitizer DTM-1 and the second digitizer DTM-2 may not overlap the holes HL defined in the folding part SPP-F of the support plate SPP in a plan view.

The third digitizer DTM-F may overlap the holes HL defined in the folding part SPP-F of the support plate SPP in a plan view. The third digitizer DTM-F may be electrically connected to one of the first digitizer DTM-1 and the second digitizer DTM-2. The third digitizer DTM-F detects the input by the electromagnetic pen, which is applied to the folding area FA0.

The third digitizer DTM-F may be connected to a circuit board through the connected digitizer among the first digitizer DTM-1 and the second digitizer DTM-2. In an embodiment, the third digitizer DTM-F may be connected to the first digitizer DTM-1 through a connection member CNP. The connection member CNP may include an anisotropic conductive film ACF. A description of specific components included in the digitizer DTM will be made below.

In an embodiment, it is illustrated that the first digitizer DTM-1 and the second digitizer DTM-2 are directly arranged in the support plate SPP. However, this is exemplarily illustrated, the first digitizer DTM-1 and the second digitizer DTM-2 may be coupled to the support plate SPP through a predetermined adhesive layer, and the present disclosure is not limited to an embodiment.

The lower member LM may include a metal layer ML, a cushion layer CS, the metal plate MP, a heat dissipation layer HRP, a magnetic field shielding sheet MSM, and a step compensation member AS that are arranged under the digitizer DTM.

The metal layer ML may be disposed under the digitizer DTM. The metal layer ML may include a first metal layer ML1 and a second metal layer ML2 overlapping the first non-folding part SPP-1 and the second non-folding part SPP-2, respectively in a plan view. The first metal layer ML1 and the second metal layer ML2 may overlap a portion of the folding part SPP-F and may be spaced apart from each other in an area overlapping the folding part SPP-F in a plan view.

The metal layer ML may have greater electrical conductivity and thermal conductivity than those of the metal plate MP, which will be described below. The metal layer ML may radiate, to the outside, heat generated when the digitizer DTM is driven. The metal layer ML transfers, to the lower side, the heat generated from the digitizer DTM. Further, the metal layer ML having relatively high electrical conductivity may prevent electromagnetic waves generated from the electronic module EM (see FIG. 2A) disposed on the lower side from affecting the digitizer DTM as noise. The metal layer ML may include copper or aluminum.

A seventh adhesive layer AL7 may couple the digitizer DTM and the metal layer ML. The seventh adhesive layer AL7 may include a first part AL7-1 and a second part AL7-2 corresponding to the first metal layer ML1 and the second metal layer ML2.

A first cushion layer CS1 overlaps the first digitizer DTM-1, and a second cushion layer CS2 overlaps the second digitizer DTM-2 in a plan view. A third cushion layer CS3 is disposed in the folding area FA0 and overlaps the third digitizer DTM-F in a plan view.

When the display device DD is folded, the first cushion layer CS1 and the second cushion layer CS2 may prevent foreign substances from being introduced into the holes HL. Further, when the display device DD is unfolded, even when the folding part SPP-F is folded with a predetermined curvature, the first cushion layer CS1 and the second cushion layer CS2 are spaced apart from each other in an area overlapping the third digitizer DTM-F in a plan view, and thus a shape of the digitizer DTM may be easily changed.

The cushion layer CS may be disposed under the metal layer ML. The cushion layer CS may protect the display module DM from an impact transmitted from the lower portion of the display module DM. The cushion layer CS may include foam or sponge. The foam may include polyurethane foam or thermoplastic polyurethane foam. When the cushion layer CS includes the foam, a barrier film as a base layer may be added to the cushion layer CS, and the cushion layer CS may be formed by foaming a foaming agent onto the barrier film.

An eighth adhesive layer AL8 may couple the metal layer ML and the cushion layer CS. The eighth adhesive layer AL8 may include a first part AL8-1 and a second part AL8-2 corresponding to the first cushion layer CS1 and the second cushion layer CS2.

The metal plate MP may be disposed under the cushion layer CS. The metal plate MP may include a first metal plate MP1 and a second metal plate MP2 overlapping the first cushion layer CS1 and the second cushion layer CS2, respectively in a plan view. The metal plate MP may absorb an external impact applied from the lower side. The metal plate MP may have a greater strength and a greater thickness than those of the metal layer ML. The metal plate MP may include a metal material such as stainless steel.

A ninth adhesive layer AL9 couples the cushion layer CS and the metal plate MP. The ninth adhesive layer AL9 may include a first part AL9-1 and a second part AL9-2 corresponding to the first metal plate MP1 and the second metal plate MP2.

The heat dissipation layer HRP may be disposed under the metal plate MP. The heat dissipation layer HRP may include a first heat dissipation layer HRP1 and a second heat dissipation layer HRP2 overlapping the first metal plate MP1 and the second metal plate MP2, respectively in a plan view. The heat dissipation layer HRP may dissipate heat generated from electronic components arranged on the lower side. The electronic components may be the electronic module EM illustrated in FIGS. 2A and 2B. The heat dissipation layer HRP may have a structure in which an adhesive layer and a graphite layer are alternately laminated. The heat dissipation layer HRP may be attached to the metal plate MP through an additional adhesive layer disposed between the heat dissipation layer HRP and the metal plate MP.

The magnetic field shielding sheet MSM is disposed under the metal plate MP. The magnetic field shielding sheet MSM shields a magnetic field generated from a magnetic body (not illustrated) disposed on the lower side. The magnetic field shielding sheet MSM may prevent the magnetic field generated from the magnetic object from interfering with the digitizer DTM.

The magnetic field shielding sheet MSM includes a plurality of parts. At least some of the plurality of parts may have different thicknesses. The plurality of parts may be arranged to match a step of a bracket (not illustrated) disposed under the display device DD. The magnetic field shielding sheet MSM may have a structure in which a magnetic field shielding layer and an adhesive layer are alternately laminated. A portion of the magnetic field shielding sheet MSM may be attached directly to the metal plate MP.

The step compensation member AS is coupled to a lower side of the seventh adhesive layer AL7. The step compensation member AS may be a double-sided tape or an insulating film. The step compensation member AS may be provided as a first step compensation member AS-1 and a second step compensation member AS-2 and may compensate for a step formed due to different widths of the components included in the lower member LM.

Through holes LTH may be defined in some members of the lower member LM. The through-hole LTH is disposed to overlap the sensing area DP-TA of FIG. 2A. As illustrated in FIG. 5A, the through-hole LTH may pass from the fifth adhesive layer AL5 to the metal plate MP. The through-hole LTH may be equal to a path obtained by removing a light shielding structure from a path for an optical signal, and the through-hole LTH may improve optical signal reception efficiency of the electro-optical module ELM.

In the lower member LM according to an embodiment, at least one of the metal layer ML, the cushion layer CS, the metal plate MP, and the step compensation member AS may be omitted, but the present disclosure is not limited to an embodiment.

Meanwhile, a lower member LM-F (hereinafter, referred to as a lower member of the third digitizer) may be disposed under the third digitizer DTM-F. The lower member LM-F of the third digitizer DTM-F may be provided in a configuration corresponding to the lower member LM. In an embodiment, it is illustrated that the lower member LM-F of the third digitizer includes a metal layer ML-F, a cushion layer CS-F, a metal plate MP-F, and a step compensation member AS-F. However, this is exemplarily illustrated, and the lower member LM-F of the third digitizer may also be provided in a configuration different from the lower member LM, but the present disclosure is not limited to an embodiment.

Figure 6A:
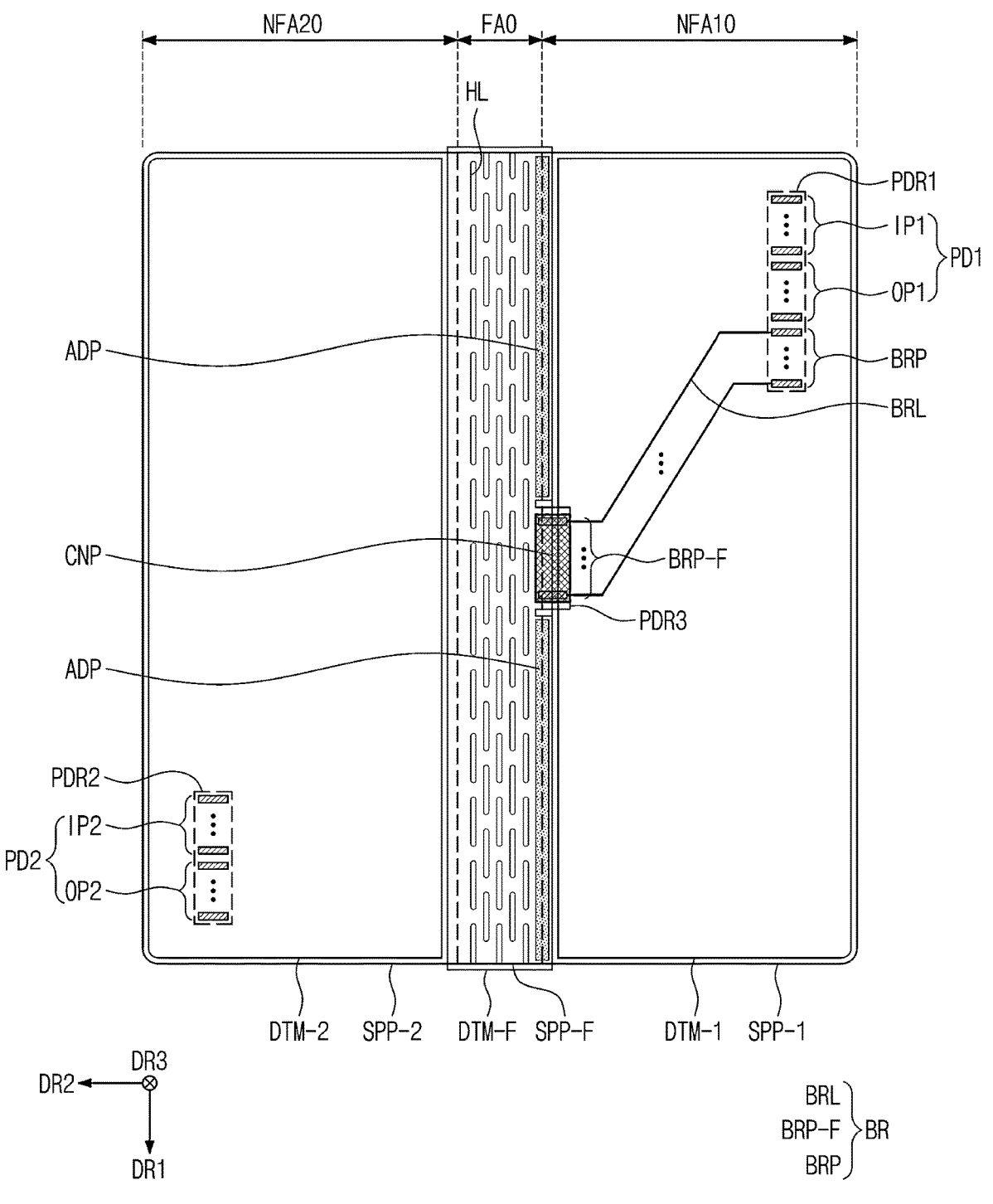
FIG. 6A is a plan view illustrating a portion of the electronic device according to an embodiment of the present disclosure.
Figure 6B:
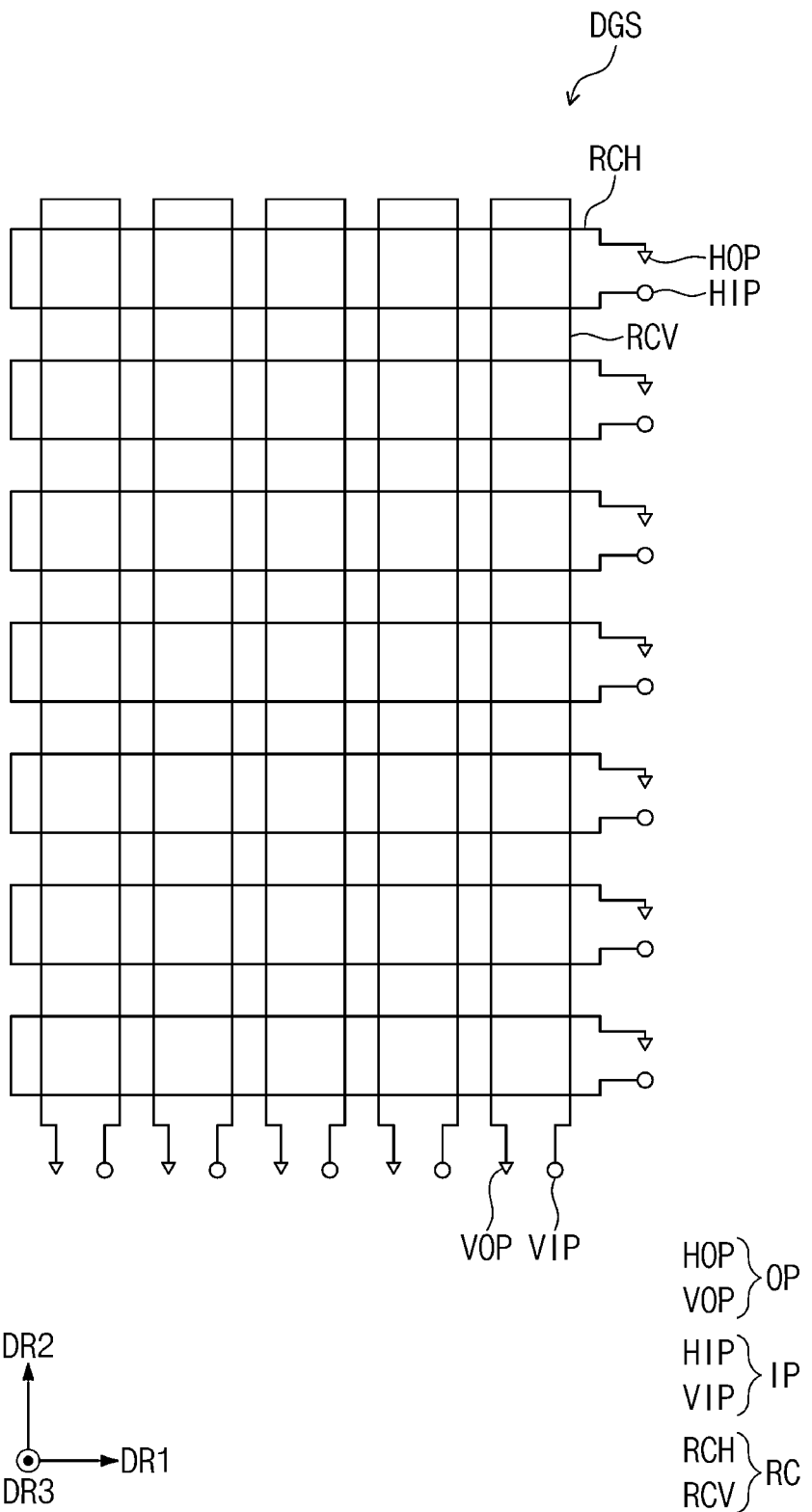
FIG. 6B is a schematic plan view illustrating a configu-ration of a digitizer according to an embodiment of the present disclosure.
Figure 6C:
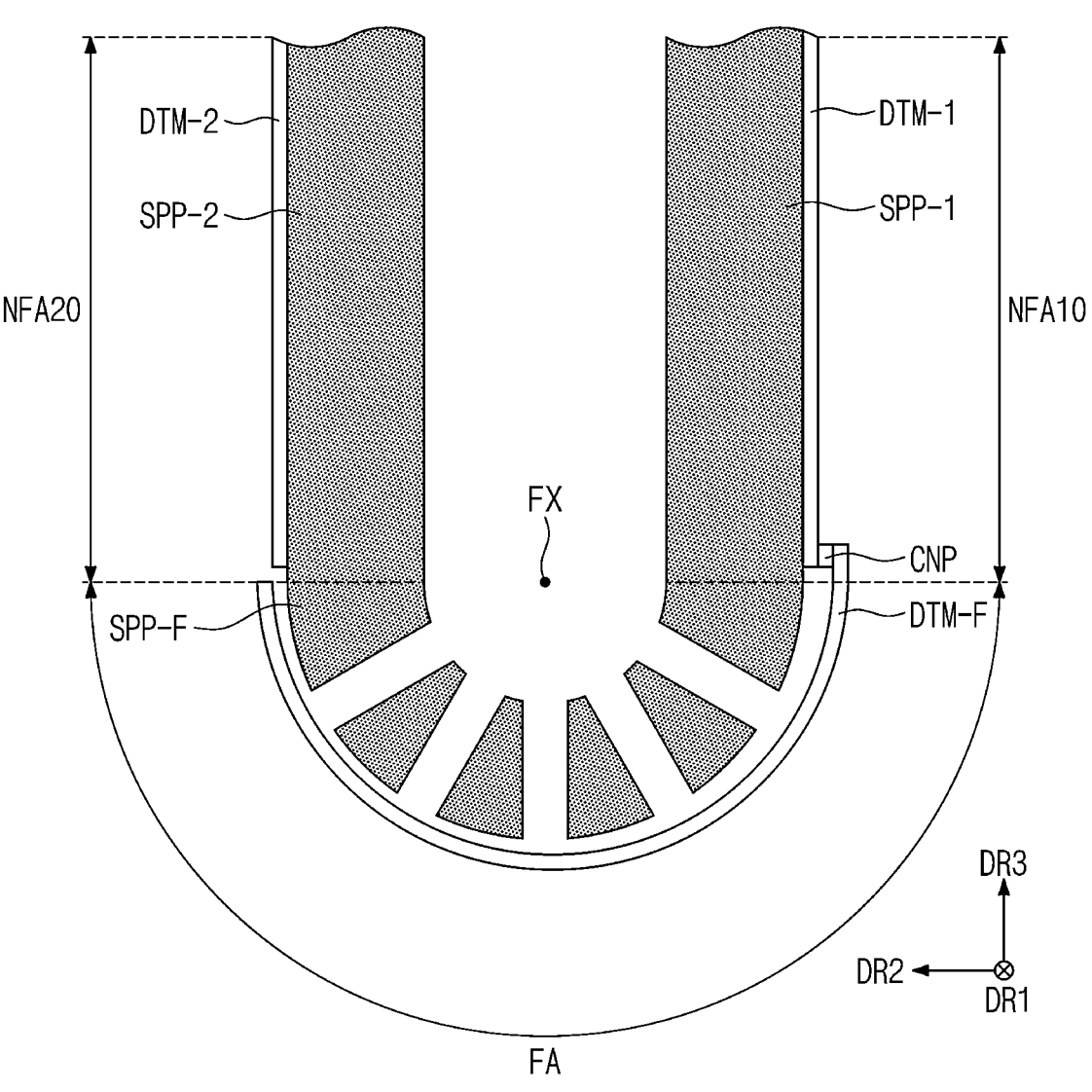
FIG. 6C is a side view illustrating a portion of the electronic device in a folded state.

FIG. 6A is a plan view illustrating a portion of the electronic device according to an embodiment of the present disclosure. FIG. 6B is a schematic plan view illustrating a configuration of a digitizer according to an embodiment of the present disclosure. FIG. 6C is a side view illustrating a portion of the electronic device in a folded state. FIGS. 6A and 6C illustrate only the support plate SPP and the digitizer DTM for easy description. Hereinafter, the present disclosure will be described with reference to FIGS. 6A to 6C. Meanwhile, the same reference numerals are assigned to the same components as those described with reference to FIGS. 1A to 5B, and a duplicated description thereof will be omitted.

Referring to FIG. 6A, the digitizer DTM is disposed on a rear surface of the support plate SPP. Each of the first digitizer DTM-1, the second digitizer DTM-2, and the third digitizer DTM-F may include independent sensors. The first digitizer DTM-1 includes a senor disposed in a first non-folding part SPP-1 and detects an external input applied to the first non-folding area NFA10. The second digitizer DTM-2 includes a senor disposed in a second non-folding part SPP-2 and detects an external input applied to the second non-folding area NFA20.

The sensor of the first digitizer DTM-1 and the sensor of the second digitizer DTM-2 may be spaced apart from each other in the second direction DR2. The sensor of the first digitizer DTM-1 and the sensor of the second digitizer DTM-2 may be connected to separate circuit boards and may transmit/receive signals independent of each other. The first digitizer DTM-1 and the second digitizer DTM-2 may be driven independently of each other.

The third digitizer DTM-F includes sensors arranged in the folding part SPP-F and detects an external input applied to the folding area FA0. The third digitizer DTM-F may be formed and provided separately from the first digitizer DTM-1 and the second digitizer DTM-2.

The first digitizer DTM-1 may include a sensor DGS and a bridge BR. The sensor DGS may include a plurality of first loop coils RC1 and a plurality of first pads PD1. The first loop coils RC1 may include first coils RCH1 and second coils RCV1, referring to FIGS. 6B and 7A. The first loop coil RC1 may be disposed in the first non-folding area NFA10. The sensor DGS is connected to the circuit board through the first pad PD1. An electrical signal transmitted through the first sensor pad PD1 may be transmitted to the first loop coil RC1 and may detect the external input applied to the first non-folding area NFA10. The sensor DGS will be described with reference to FIG. 6B.

As illustrated in FIG. 6B, the loop coils RC may include a plurality of first coils RCH (hereinafter, referred to as first coils) and a plurality of second coils RCV (hereinafter, referred to as second coils). The first coils RCH may be referred to as driving coils, and the second coils RCV may be referred to as detection coils.

Each of the first coils RCH may extend in the first direction DR1, and the first coils RCH may be spaced apart from each other in the second direction DR2. Each of the second coils RCV may extend in the second direction DR2, and the second coils RCV may be spaced apart from each other in the first direction DR1.

One ends of the first coils RCH are connected to input terminals HIP, and the other ends thereof are connected to output terminals HOP. Alternating current ("AC") signals may be sequentially provided to the input terminals HIP, and the output terminals HOP may have a constant voltage, for example, may be grounded. Accordingly, the first coils RCH may be formed in a closed curve shape, and when a current flows through the first coils RCH, a magnetic force line may be induced between the first coils RCH and the second coils RCV.

One ends the second coils RCV are connected to input terminals VIP, and the other ends thereof are connected to output terminals VOP. The output terminals VOP may have a constant voltage, for example, may be grounded. Accordingly, the second coils RCV may be formed in a closed curve shape, and the second coils RCV may output, to the output terminals VOP of the second coils RCV, signals obtained by detecting an induced electromagnetic force emitted from the electromagnetic pen.

FIG. 6B exemplarily illustrates the sensor DGS according to an embodiment, but the present disclosure is not limited thereto. An arrangement relationship between the first coils RCH and the second coils RCV is not limited to that illustrated in FIG. 6A and may be variously modified. Meanwhile, although not illustrated, each of the second digitizer DTM-2 and the third digitizer DTM-F may include sensor units having the same structure as that of the first digitizer DTM-1. However, this is exemplarily described, and the second digitizer DTM-2 and the third digitizer DTM-F may include coils having an arrangement relationship that is different from that of the first digitizer DTM-1 as long as the second digitizer DTM-2 and the third digitizer DTM-F may independently detect external inputs applied to the second non-folding area NFA20 and the folding area FA0, but the present disclosure is not limited to an embodiment.

Referring back to FIG. 6A, the first pads PD1 may include a plurality of first input pads IP1 and a plurality of first output pads OP1. The first input pads IP1 may include the input terminals HIP and VIP illustrated in FIG. 6B, and the first output pads OP1 may include the output terminals HOP and VOP illustrated in FIG. 6B.

The bridge BR overlaps the first non-folding area NFA10. The bridge BR may be electrically insulated from the sensor DGS. The bridge BR may include a plurality of bridge lines BRL (hereinafter, referred to as bridge lines), a plurality of first bridge pads BRP, and a plurality of second bridge pads BRP-F.

The bridge lines BRL may be insulated from and intersect the first loop coil RC. For example, the bridge lines BRL and a first coil RCH1 may be arranged on different layers from each other. However, this is exemplarily illustrated, and in another embodiment, the bridge lines BRL and the first loop coil RC1 may be arranged on the same layer as long as the bridge lines BRL and the first loop coil RC1 are electrically insulated from each other, but the present disclosure is not limited to an embodiment.

For easy description, some of the bridge lines BRL are illustrated in FIG. 6A. The bridge lines BRL overlap the first non-folding area NFA10. The bridge lines BRL may be insulated from and intersect the loop coils RC of the first digitizer DTM-1.

The first bridge pads BRP may be provided to a first pad part PDR1. The first bridge pads BRP may be connected to one ends of the bridge lines BRL, respectively. The second bridge pads BRP-F may be provided to a place different from the first pad part PDR1. The second bridge pads BRP-F may be connected to the other ends of the bridge lines BRL, respectively. That is, the bridge lines BRL may be lines that electrically connect the first bridge pads BRP and the second bridge pads BRP-F.

The second digitizer DTM-2 is disposed in the second non-folding part SPP-2 and overlaps the second non-folding area NFA20. The first digitizer DTM-1 and the second digitizer DTM-2 may be provided at positions that do not overlap the holes HL in a plan view.

The second digitizer DTM-2 may include the sensor DGS illustrated in FIG. 6A. That is, the second digitizer DTM-2 may include a second loop coil RC2 and second pads PD2. The second loop coil RC2 may include first coils RCH2 and second coils RCV2 illustrated in FIGS. 6B and 7A, and the second pads PD2 may include second input pads IP2 and second output pads OP2. The second input pads IP2 may include the input terminals HIP and VIP illustrated in FIG. 6B, and the second output pads OP2 may include the output terminals HOP and VOP illustrated in FIG. 6B.

The third digitizer DTM-F is disposed in the folding part SPP-F and overlaps the folding area FA0. The third digitizer DTM-F is electrically connected to the first digitizer DTM-1 through the connection member CNP. However, this is exemplarily illustrated, and the third digitizer DTM-F may be electrically connected to the second digitizer DTM-2, but the present disclosure is not limited to an embodiment.

The third digitizer DTM-F may include the sensor DGS illustrated in FIG. 6B. That is, the third digitizer DTM-F may include a third loop coil RC3 and third pads PD3 (Refer to FIG. 7B). The third loop coil RC3 may include the first coils RCH3 and the second coils RCV3 illustrated in FIGS. 7B to 9B, and the third pads PD3 may include the input terminals HIP and VIP and the output terminals HOP and VOP illustrated in FIG. 6B.

The third pads PD3 may be provided to a connection pad part PDR3 of the first digitizer DTM-1. The third pads PD3 are connected to the bridge BR through the connection member CNP. The circuit board may be provided in the first pad part PDR1 via the first non-folding area NFA10 through the first bridge pad BRP, the bridge line BRL, and the second bridge pad BRP-F, and electrically connected to the third digitizer DTM-F. However, this is exemplarily described, the first bridge pad BRP connected to the third pads PD3 may be provided at a different position that is distinguished from that of the first pad part PDR1 and may be connected to a separate circuit board independent of the circuit board connected to the first pads PD1, and the present disclosure is not limited thereto. Referring to FIG. 6C, when the electronic device ED is folded, the support plate SPP is also folded with respect to a folding axis. The first digitizer DTM-1 and the second digitizer DTM-2 are provided in the first non-folding area NFA10 and the second non-folding area NFA20 and thus are not folded. Accordingly, a folding stress according to the folding operation is not applied to the first digitizer DTM-1 and the second digitizer DTM-2, and thus stable electrical reliability may be provided.

The third digitizer DTM-F may be provided in the folding area FA0 and connected to the first digitizer DTM-1 through the connection member CNP. The digitizer DTM according to the present disclosure may further include the third digitizer DTM-F and thus may easily detect the external input applied to the folding area FA0. Further, as the third digitizer DTM-F is provided separately from the first digitizer DTM-1 or the second digitizer DTM-2, a material or structure of a layer constituting the third digitizer DTM-F may be designed independently of the first digitizer DTM-1 or the second digitizer DTM-2. Accordingly, the third digitizer DTM-F having improved folding properties may be provided in the folding area FA0, and thus the digitizer DTM having improved reliability may be provided even when the electronic device ED is folded. Further, as the third digitizer DTM-F is connected to the first digitizer DTM-1 or the second digitizer DTM-2, a separate circuit board for driving the third digitizer DTM-F may be omitted, and thus a simplified electronic device may be provided.

Meanwhile, the electronic device ED according to the present disclosure may further include an adhesive member ADP for connecting the third digitizer DTM-F and the support plate SPP. A plurality of adhesive members ADL may be spaced apart from each other in the second direction DR2 with the connection member CNP interposed therebetween, but the present disclosure is not limited thereto. The electronic device ED may further include the adhesive member ADP, thereby supplementing an adhesive force of the connection member CNP. Accordingly, when the electronic device ED is folded, movement of the third digitizer DTM-F may be minimized, and the third digitizer DTM-F may be prevented from being separated from the support plate SPP. Further, the first digitizer DTM-1 and the second digitizer DTM-2 are separately driven, and the sensor is provided in the folding area through the third digitizer DTM-F. Thus, as the detection coils of which a shape is changed to pass between the holes in the folding area are omitted, the electronic device including the digitizer having improved sensing sensitivity may be provided.

Figure 7A:
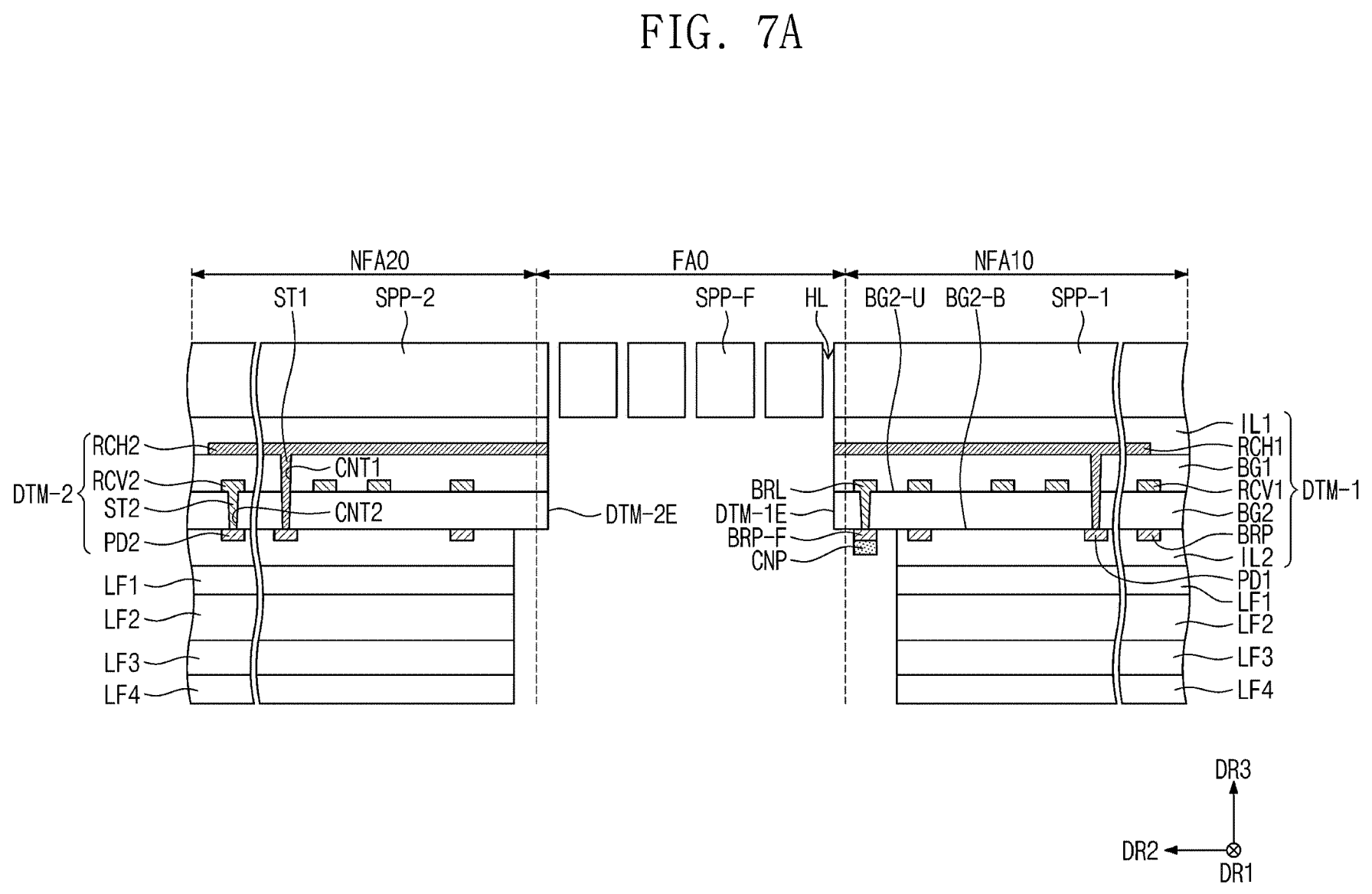
Figure 7B:
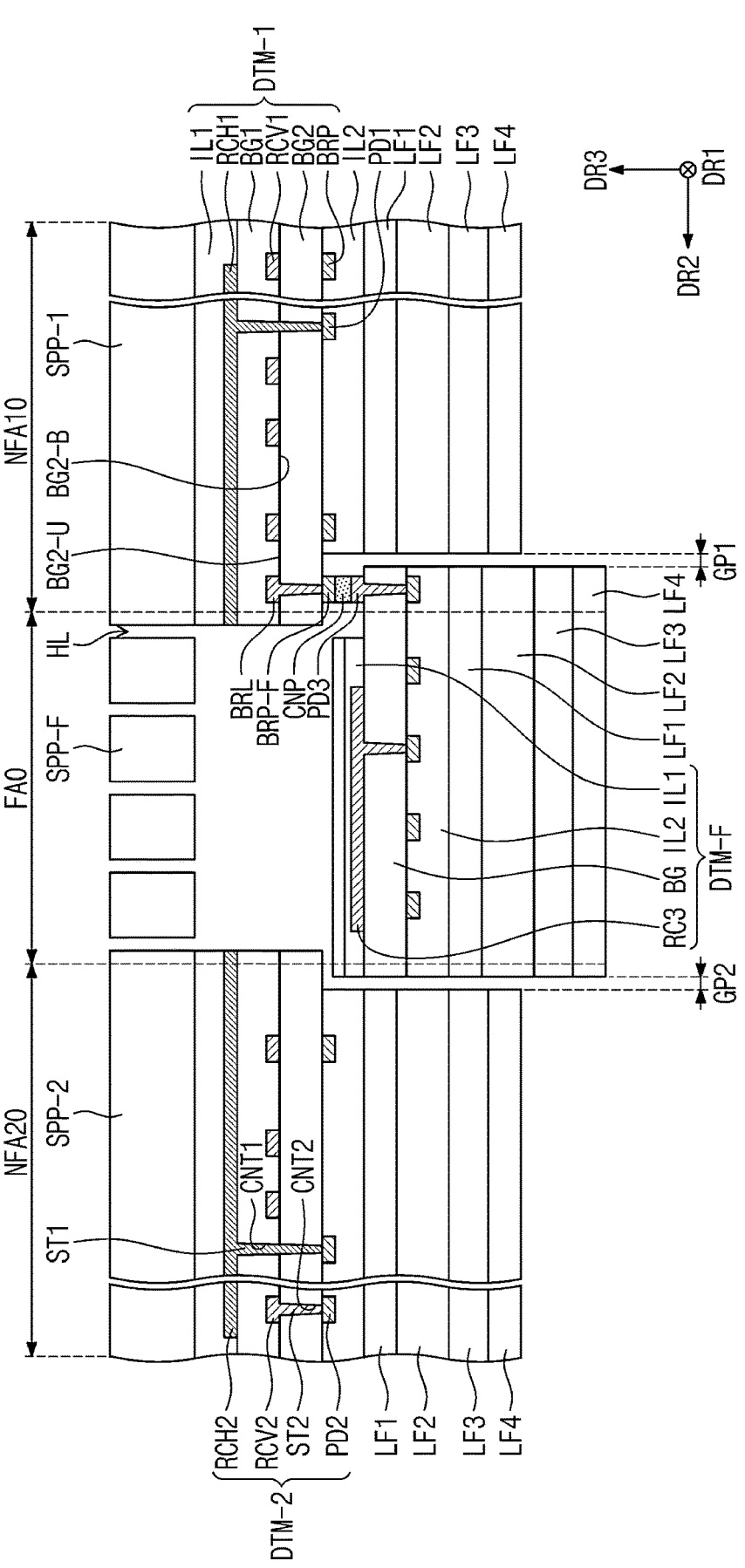

FIGS. 7A and 7B are cross-sectional views illustrating a portion of the electronic device according to an embodiment of the present disclosure. FIG. 7A illustrates a state in which the support plate SPP, the first digitizer DTM-1, and the second digitizer DTM-2 are coupled, and FIG. 7B illustrates a state in which the third digitizer DTM-F is additionally coupled thereto. Hereinafter, the present disclosure will be described with reference to FIGS. 7A and 7B. Meanwhile, the same reference numerals are assigned to the same components as those described with reference to FIGS. 1A to 6C, and a duplicated description thereof will be omitted.

Referring to FIG. 7A, the first digitizer DTM-1 may include a first base layer BG1, a second base layer BG2, the first coils RCH1, the second coils RCV1, the first pads PD1, the bridge lines BRL, first bridge pads BRP, second bridge pads BRP-F, a first cover layer IL1, and a second cover layer IL2. The first coils RCH1, the second coils RCV1, and the bridge lines BRL may include copper.

The first coils RCH1 may be arranged on the first base layer BG1. The second base layer BG2 may be disposed under the first base layer BG1. The second coils RCV1 may be arranged on a front surface BG2-U of the second base layer BG2. Bridge BR (e.g., first bridge pad BRP) may be arranged on a rear surface BG2-B of the second base layer BG2. According to an embodiment, the second base layer BG2 may include the same material as that of the first base layer BG1.

The first cover layer IL1 may be disposed on the first base layer BG1 and cover the first coils RCH. The second cover layer IL2 may be disposed on the rear surface BG2-B of the second base layer BG2 and cover the bridge lines BRL. According to an embodiment, the first cover layer IL1 and the second cover layer IL2 may include the same material as that of the first base layer BG1. However, this is exemplarily described, and the first cover layer IL1 and the second cover layer IL2 may include a different material from that of the first base layer BG1. For example, the second cover layer IL2 may be an adhesive layer.

According to an embodiment, the first coils RCH and the second coils RCV may not be arranged in the folding part SPP-F. Accordingly, an arrangement design for the first coils RCH and the second coils RCV to pass between the holes HL may be omitted, and when the electronic device ED (see FIG. 1B) is folded, cracks occurring in the first coils RCH and the second coils RCV may be prevented.

Some of the first coils RCH may be connected to a corresponding connection pattern through a first contact hole CNT1 defined through the first base layer BG1 and the second base layer BG2. Likewise, some of the second coils RCV may be connected to a corresponding connection pattern through a base layer. According to an embodiment, the first coils RCH and the second coils RCV may be arranged on different layers and thus may be insulated from and intersect each other in a plan view.

The second bridge pads BRP-F may be arranged on the rear surface BG2-B of the second base layer BG2. The second bridge pads BRP-F may be exposed from the second cover layer IL2. That is, a portion of the second cover layer IL2 may be removed so that the second bridge pads BRP-F are exposed. The connection member CNP may be disposed on the second bridge pads BRP-F.

The connection member CNP may be conductive. For example, the connection member CNP may be an anisotropic conductive film. The connection member CNP is electrically/physically coupled to the second bridge pads BRP-F.

The second digitizer DTM-2 may have the same layer structure as that of the first digitizer DTM-1 but may have a structure in which the bridge BR is omitted. In detail, the second digitizer DTM-2 may include the first base layer BG1, the second base layer BG2, first coils RCH2, second coils RCV2, the first cover layer IL1, and the second cover layer IL2.

Referring to FIG. 7B, the third digitizer DTM-F may include the base layer BG, first coils RCH3, second coils RCV3, the third pads PD3, the first cover layer IL1, and the second cover layer IL2. The third digitizer DTM-F may be spaced apart in a predetermined distance GP1 from lower members LF1 to LF4 arranged in the first non-folding area NFA10 and spaced a predetermined distance GP2 from lower members LF1 to LF4 arranged in the second non-folding area NFA20 in the second direction DR2.

The first coils RCH3 and the second coils RCV3 may be arranged on different layers from each other. In an embodiment, the first coils RCH3 may be arranged an upper surface of the base layer BG, and the second coils RCV3 may be arranged on a rear surface of the base layer BG.

The third pads PD3 may be arranged on the upper surface of the base layer BG and exposed from the first cover layer IL1. The third pads PD3 may be electrically connected to the second bridge pads BRP-F through the connection member CNP. The third digitizer DTM-F may be selectively connected to one of the first digitizer DTM-1 and the second digitizer DTM-2. In an embodiment, the third digitizer DTM-F may be electrically connected to the first digitizer DTM-1 through the connection member CNP.

Lower layers LF1, LF2, LF3, and LF4 of the first digitizer DTM-1 may be included in layers constituting the lower member LM illustrated in FIG. 5A, respectively. That is, each of the lower layers LF1, LF2, LF3, and LF4 may include any one of the metal layer ML, the cushion layer CS, the metal plate MP, the heat dissipation layer HRP, and the magnetic field shielding sheet MSM illustrated in FIG. 5A.

In an embodiment, lower layers LF1, LF2, LF3, and LF4 of the third digitizer DTM-F may have the same laminated structure as that of the lower layers LF1, LF2, LF3, and LF4 of the first digitizer DTM-1. Accordingly, the digitizers DTM-1 and DTM-2 arranged in the non-folding areas NFA10 and NFA20 and the third digitizer DTM-F disposed in the folding area FA0 may be supported by the same lower members, and thus an environment for input detection may be uniformly provided in the folding area FA0 and the non-folding areas NFA10 and NFA20.

Figure 8:
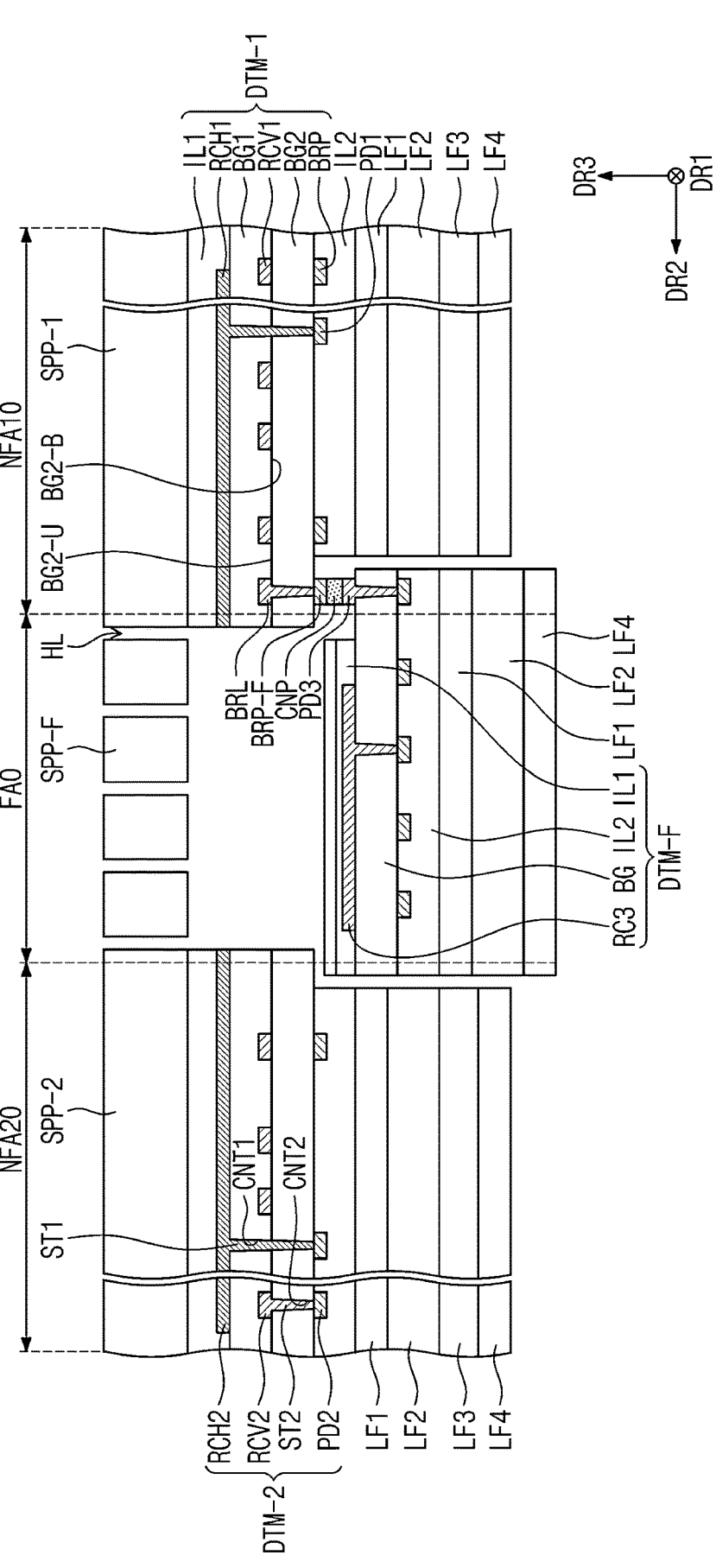
FIG. 8 is a cross-sectional view illustrating a portion of the electronic device according to an embodiment of the present disclosure.

FIG. 8 is a cross-sectional view illustrating a portion of the electronic device according to an embodiment of the present disclosure. For easy description, FIG. 8 illustrates an area corresponding to FIG. 7B. Hereinafter, the present disclosure will be described with reference to FIG. 8. Meanwhile, the same reference numerals are assigned to the same components as those described with reference to FIGS. 1A to 7B, and a duplicated description thereof will be omitted.

Referring to FIG. 8, in the electronic device ED, the lower member LM-F of the third digitizer DTM-F may have a different layer structure from a layer structure of the lower members LM arranged in the non-folding areas NFA10 and NFA20. In an embodiment, the lower member LM-F of the third digitizer DTM-F may have a structure in which the third lower layer LF3 is omitted when compared to a lower side of the first digitizer DTM-1.

The third lower layer LF3 may correspond to the metal layer ML (see FIG. 5B) illustrated in FIG. 5B. That is, the third lower layer LF3 may be a layer having a heat dissipation function and an electromagnetic wave blocking function. The third digitizer DTM-F is disposed in the folding area FA0 that is narrower than the first and second non-folding areas NFA10 and NFA20, and thus may be provided with a relatively small area as compared to the first and second digitizers DTM-1 and DTM-2. Accordingly, even when there is no heat dissipation layer, emitted heat may be relatively small. Accordingly, even when the third lower layer LF3 is omitted, a stable external input detection environment may be provided.

Further, the third digitizer DTM-F is connected to the third lower layer LF3 disposed in the non-folding areas NFA10 and NFA20, and thus electromagnetic waves may be easily blocked. According to the present disclosure, the lower member disposed under the third digitizer DTM-F includes fewer layers than that of the lower members arranged in the non-folding areas NFA10 and NFA20, a thickness of the third digitizer DTM-F in the folding area FA may be reduced, and thus improved folding properties may be achieved.

Figure 9A:
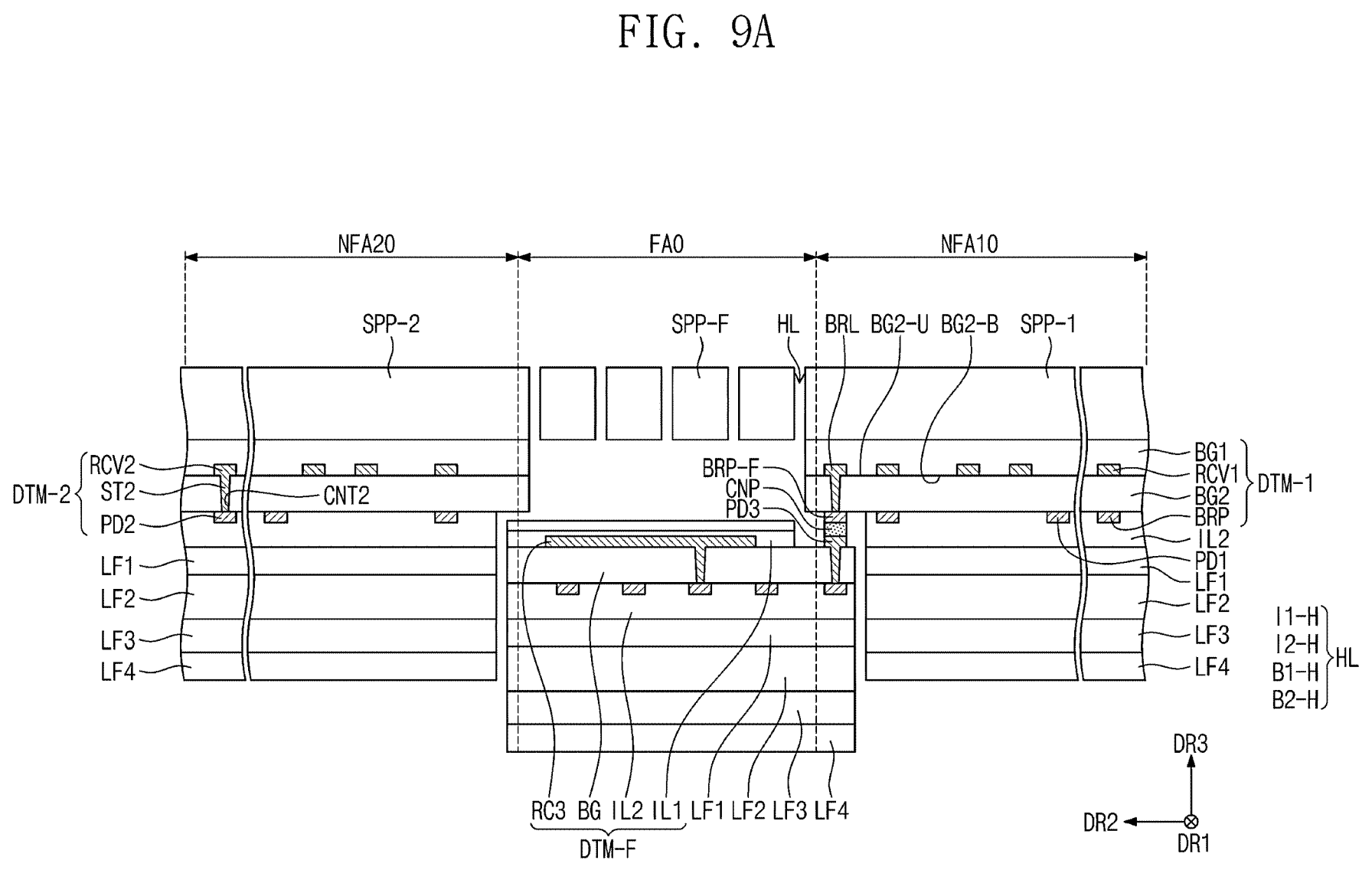

FIGS. 9A and 9B are cross-sectional views illustrating a portion of the electronic device according to an embodiment of the present disclosure. For easy description, FIGS. 9A and 9B illustrate an area corresponding to FIG. 7B. Hereinafter, the present disclosure will be described with reference to FIGS. 9A and 9B. Meanwhile, the same reference numerals are assigned to the same components as those described with reference to FIGS. 1A to 8, and a duplicated description thereof will be omitted.

Referring to FIG. 9A, each of the first digitizer DTM-1 and the second digitizer DTM-2 may have the same layer structure as that of the third digitizer DTM-F. For example, the first digitizer DTM-1 may include the base layer BG, first coils RCH1, second coils RCV1, the first pads PD1, the first bridge pads BRP, the second bridge pads BRP-F, the first cover layer IL1, and the second cover layer IL2. The first coils RCH1 may be arranged on the upper surface of the first base layer BG1, and the second coils RCV1 may be arranged on the rear surface of the first base layer BG1.

The first pads PD1, the first bridge pads BRP, and the second bridge pads BRP-F are arranged on a lower surface of the base layer BG. Although not illustrated, the first bridge pads BRP and the second bridge pads BRP-F may be exposed from the second cover layer IL2 in the first pad part PDR1 (see FIG. 6A). The second bridge pads BRP-F may be adjacent to the folding area FA, may be exposed from the second cover layer IL2, and may define the connection pad part PDR3 (see FIG. 6A). The third pads PD3 may be electrically connected to the second bridge pads BRP-F through the connection member CNP.

The second digitizer DTM-2 may include the base layer BG, the first coils RCH2, the second coils RCV2, the second pads PD2, the first cover layer IL1, and the second cover layer IL2. The first coils RCH2 may be arranged the upper surface of the base layer BG, and the second coils RCV2 may be arranged on the rear surface of the base layer BG. The second pads PD2 may be disposed on the lower surface of the base layer BG and may be exposed from the second cover layer IL2 at a second pad part PDR2 (see FIG. 6A) although not illustrated.

Referring to FIG. 9B, each of the first digitizer DTM-1S and the second digitizer DTM-2S may be inserted into the support plate SPP. For example, the base layer BG (e.g., the first and second base layers BG1 and BG2), the first cover layer IL1, and the second cover layer IL2 included in the first digitizer DTM-1S may be included in the first non-folding part SPP-1 of the support plate SPP. At least one of the base layer BG, the first cover layer IL1, and the second cover layer IL2 may include a reinforcing fiber composite or a prepreg. For example, the base layer BG may include fiber-reinforced plastic, and each of the first cover layer IL1 and the second cover layer IL2 may include an insulating layer. Alternatively, each of the base layer BG, the first cover layer IL1, and the second cover layer IL2 may include a reinforcing fiber composite or a prepreg. The second digitizer DTM-2S may have the same layer structure as that of the first digitizer DTM-1S.

The first digitizer DTM-1S and the second digitizer DTM-2S may be manufactured simultaneously with the support plate SPP. Unlike this, the third digitizer DTM-F may be manufactured separately from the first digitizer DTM-1 and the second digitizer DTM-2. According to the present disclosure, since the third digitizer DTM-F is separately further included, defects such as digitizer disconnection in the folding area FA0 may be prevented. Accordingly, a digitizer that may effectively prevent sensitivity degradation in a foldable electronic device and has improved electrical reliability may be provided.

Figure 10A:
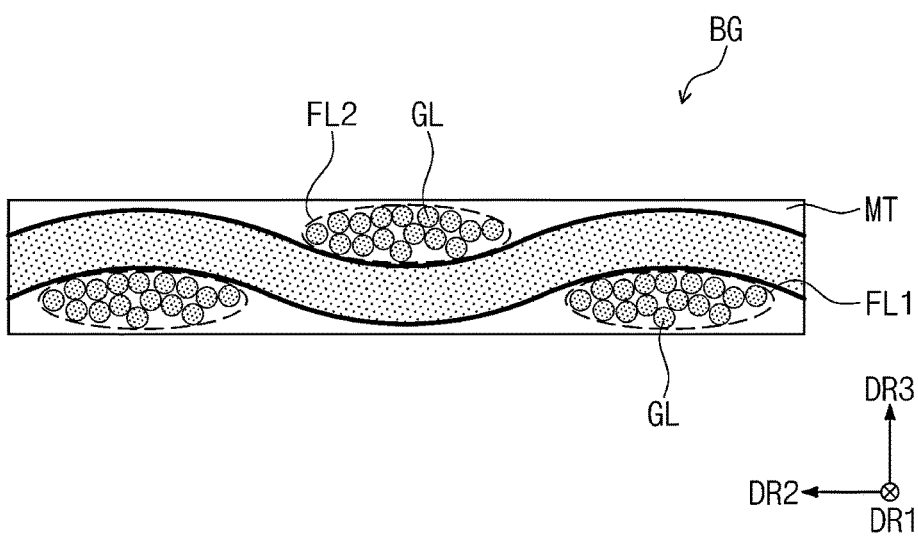
FIG. 10A is a cross-sectional view of a base layer included in the digitizer according to an embodiment of the present disclosure.
Figure 10B:
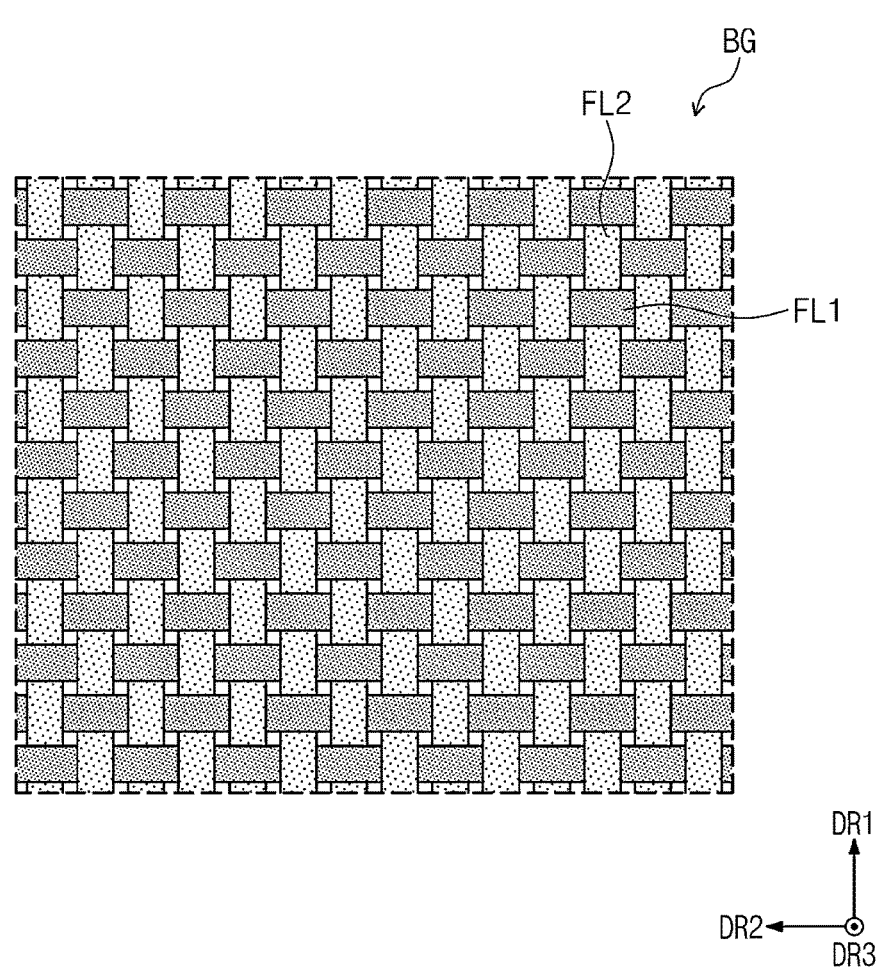
FIG. 10B is a plan view of the base layer included in the digitizer according to an embodiment of the present disclo-sure.

FIG. 10A is a cross-sectional view of a base layer included in the digitizer according to an embodiment of the present disclosure. FIG. 10B is a plan view of the base layer included in the digitizer according to an embodiment of the present disclosure. A description of the base layer BG, which will be described in FIGS. 10A and 10B, may be applied to the support plate SPP illustrated in FIG. 5A and the base layers BG1, BG2, and BG3 and the cover layers IL1 and IL2 illustrated in FIG. 9B.

Referring to FIGS. 10A and 10B, the base layer BG according to the present disclosure may include a matrix MT including a filler and woven fiber lines FL1 and FL2 arranged inside the matrix MT.

The fiber lines FL1 and FL2 may be alternately arranged in the first direction DR1 and the second direction DR2 to have a fabric shape in a plan view. Each of the fiber lines FL1 and FL2 may be provided in the form of a bundle of a plurality of fibers GL. A diameter of one stand of the fiber GL included in one fiber line may be in a range of 3 μm to 10 μm.

Each of the fiber lines FL1 and FL2 may include a reinforcing fiber composite. The reinforced fiber composite material may be one of the CFRP or the GFRP. The fiber lines FL1 and FL2 may be arranged inside the matrix MT. The matrix MT according to an embodiment may include at least one of epoxy, polyester, polyamides, polycarbonates, polypropylene, polybutylene, and vinyl ester.

The matrix MT may include a filler. The filler may include at least one of silica, barium sulphate, sintered talc, barium titanate, titanium oxide, clay, alumina, mica, boehmite, zinc borate, and zinc titanate.

According to the present disclosure, the base layer BG included in the digitizer illustrated in FIG. 9B includes fiber bundles of glass fiber reinforced plastic or carbon fiber reinforced plastic disposed inside the matrix MT, and thus when the electronic device ED is folded, a lower portion of the display device DD (see FIG. 5A) may be protected.

Thus, the digitizer according to the present disclosure may function as a protective member, and at the same time, function to detect a pen. Accordingly, a separate metal plate for protecting the display device DD may be omitted. Accordingly, the electronic device ED of which costs are reduced and which is slim may be provided.

According to the present disclosure, as a digitizer formed on a separate substrate is further disposed in a folding area, a sensor of the digitizer may not be disposed in the folding area. As the digitizer provided in the folding area and a digitizer provided in a non-folding area are provided separately, the digitizer to which a folding stress is applied may be easily changed to a material having high rigidity. Further, an electronic device including the digitizer having improved sensing sensitivity because sensing coils deformed to pass between holes of the folding area are omitted may be provided.

Although the description has been made above with reference to an embodiment of the present disclosure, it may be understood that those skilled in the art or those having ordinary knowledge in the art may variously modify and changes the present disclosure without departing from the spirit and technical scope of the present disclosure described in the appended claims. Accordingly, the technical scope of the present disclosure is not limited to the detailed description of the specification, but should be defined by the appended claims.

What is claimed is:

1. An electronic device comprising:
   a display panel including a display surface including a folding area, a first non-folding area, and a second non-folding area, and a rear surface opposite to the display surface, wherein the folding area is foldable with respect to a folding axis extending in a first direction, the first non-folding area is defined on one side of the folding area, and the second non-folding area is defined to be spaced apart from the first non-folding area with the folding area interposed therebetween in a second direction intersecting the first direction;

a first digitizer disposed on the rear surface and overlapping the first non-folding area;

a second digitizer disposed on the rear surface, spaced apart from the first digitizer, and overlapping the second non-folding area;

a third digitizer disposed on the rear surface and overlapping the folding area; and a connection member connected to the third digitizer, wherein the connection member is connected to the first digitizer and spaced apart from the second digitizer.

2. The electronic device of claim 1, further comprising a support member disposed on the rear surface of the display panel, wherein the support member includes:

a first non-folding part disposed between the display panel and the first digitizer and overlapping the first non-folding area;

a second non-folding part disposed between the display panel and the second digitizer and overlapping the second non-folding area; and a folding part disposed between the display panel and the third digitizer, connected to the first non-folding part and the second non-folding part, and overlapping the folding area, and wherein a plurality of holes are defined in the folding part.

3. The electronic device of claim 2, wherein the support member includes a base layer, and the base layer includes a plurality of fiber lines.

4. The electronic device of claim 2, wherein the first digitizer is disposed inside the first non-folding part, the second digitizer is disposed inside the second non-folding part, and the third digitizer is spaced apart from the folding part in a cross-sectional view.

5. The electronic device of claim 1, wherein the first digitizer includes:

a sensor configured to detect an external input applied to the first non-folding area; and a bridge electrically insulated from the sensor, and wherein the third digitizer is connected to the bridge.

6. The electronic device of claim 5, wherein the first digitizer includes a first pad part and a connection pad part, the connection pad part is spaced apart from the first pad part in the second direction and closer to the folding area than the first pad part, the sensor includes a first loop coil overlapping the first non-folding area, a first input pad connected to one end of the first loop coil, and a first output pad connected to the other end of the first loop coil, the bridge includes a bridge line, a first bridge pad connected to a first end of the bridge line, and a second bridge pad connected to a second end of the bridge line opposite to the first end, the first input pad, the first output pad, and the first bridge pad are arranged in the first pad part, and the second bridge pad is disposed in the connection pad part.

7. The electronic device of claim 6, wherein the connection member electrically connects the second bridge pad and the third digitizer.

8. The electronic device of claim 1, wherein the connection member includes an anisotropic conductive film.

9. The electronic device of claim 1, further comprising:

an adhesive member spaced apart from the connection member in the first direction.

10. The electronic device of claim 1, wherein the first digitizer includes glass fiber reinforced plastic, carbon fiber reinforced plastic, or prepreg.

11. The electronic device of claim 1, further comprising:

a support plate disposed between the display panel and the first to third digitizers, wherein the support plate includes a first non-folding part overlapping the first digitizer, a second non-folding part overlapping the second digitizer, and a folding part overlapping the third digitizer, and a plurality of holes are defined through the folding part.

12. The electronic device of claim 11, wherein the support plate includes glass fiber reinforced plastic, carbon fiber reinforced plastic, or prepreg.

13. An electronic device comprising:

a display panel including a display surface including a folding area, a first non-folding area, and a second non-folding area, and a rear surface opposite to the display surface, wherein the folding area is foldable with respect to a folding axis extending in a first direction, the first non-folding area is defined on one side of the folding area, and the second non-folding area is defined to be spaced apart from the first non-folding area with the folding area interposed therebetween in a second direction intersecting the first direction;

a digitizer configured to detect an electromagnetic pen; and a support plate, which is disposed between the digitizer and the display panel and in which a plurality of holes overlapping the folding area are defined, wherein the digitizer includes:

a first digitizer disposed on the rear surface and overlapping the first non-folding area;

a second digitizer disposed on the rear surface, spaced apart from the first digitizer, and overlapping the second non-folding area;

a third digitizer disposed on the rear surface and overlapping the folding area; and an anisotropic conductive film configured to connect the third digitizer and the first digitizer.

14. The electronic device of claim 13, wherein the first digitizer and the second digitizer are in contact with the support plate, and the third digitizer is spaced apart from the support plate.

15. The electronic device of claim 13, wherein the first digitizer includes a first loop coil, a bridge line electrically insulated from the first loop coil, a first pad connected to the first loop coil, a first bridge pad connected to a first end of the bridge line, and a second bridge pad connected to a second end of the bridge line opposite to the first end, and the anisotropic conductive film is connected to the second bridge pad, and the second bridge pad is closer to the folding area than the first bridge pad.

16. The electronic device of claim 15, wherein the third digitizer includes a third loop coil and a third pad connected to the third loop coil, and the anisotropic conductive film is disposed between the second bridge pad and the third pad.

17. The electronic device of claim 15, wherein the first loop coil does not overlap the folding area in an unfolded state of the electronic device.

18. The electronic device of claim 13, wherein the support plate includes glass fiber reinforced plastic, carbon fiber reinforced plastic, or prepreg.

19. The electronic device of claim 13, wherein the first digitizer and the second digitizer include glass fiber rein- forced plastic, carbon fiber reinforced plastic, or prepreg.

20. The electronic device of claim 13, further comprising:

an adhesive member configured to couple the third digi- tizer and the support plate, wherein the adhesive member is spaced apart from the anisotropic conductive film in the first direction.

\* \* \* \* \*